(12) United States Patent  
Nakano et al.

(10) Patent No.: US 8,901,571 B2  
(45) Date of Patent: Dec. 2, 2014

(54) SEMICONDUCTOR DEVICE

(71) Applicant: Rohm Co., Ltd., Kyoto (JP)

(72) Inventors: Yuki Nakano, Kyoto (JP); Shuhei Mitani, Kyoto (JP); Mineo Miura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/010,567

(22) Filed: Aug. 27, 2013

(65) Prior Publication Data

US 2014/0054611 A1   Feb. 27, 2014

Related U.S. Application Data

(62) Division of application No. 13/258,452, filed as application No. PCT/JP2010/054938 on Mar. 23, 2010, now Pat. No. 8,546,814.

(30) Foreign Application Priority Data

Mar. 25, 2009  (JP) .................................. 2009-074558  
Apr. 17, 2009  (JP) .................................. 2009-101321  
Jun. 4, 2009   (JP) .................................. 2009-134822

(51) Int. Cl.

| H01L 31/0312 | (2006.01) |
|---|---|
| H01L 29/10 | (2006.01) |
| H01L 29/16 | (2006.01) |
| H01L 29/66 | (2006.01) |
| H01L 29/78 | (2006.01) |
| H01L 29/45 | (2006.01) |
| H01L 29/04 | (2006.01) |
| H01L 29/423 | (2006.01) |

(52) U.S. Cl.

CPC ........ *H01L 29/7816* (2013.01); *H01L 29/1045* (2013.01); *H01L 29/45* (2013.01); *H01L 29/045* (2013.01); *H01L 29/1608* (2013.01); *H01L 29/66068* (2013.01); *H01L 29/7811* (2013.01); *H01L 29/4238* (2013.01); *H01L 29/42376* (2013.01); *H01L 29/7813* (2013.01); *H01L 29/4236* (2013.01); *H01L 29/1095* (2013.01)

USPC ...................................... 257/77; 257/E29.104

(58) Field of Classification Search

USPC ............................................ 257/77, E29.104  
See application file for complete search history.

(56) References Cited

U.S. PATENT DOCUMENTS 4,306,916 A  *  12/1981  Wollesen et al. ............. 438/514  
5,541,430 A      7/1996   Terashima  
(Continued)

FOREIGN PATENT DOCUMENTS

JP     3-034468 A     2/1991  
JP     5-198816 A     8/1993  
(Continued)

*Primary Examiner* — Phuc Dang  
(74) *Attorney, Agent, or Firm* — Rabin & Berdo, P.C.

(57) ABSTRACT

A semiconductor device including a semiconductor layer of a first conductivity type; a plurality of body regions of a second conductivity type; source regions of the first conductivity type, formed on a surface layer part of each body region and spaced away from the edges of each body region; a gate insulating film formed on the semiconductor layer; and gate electrodes formed on the gate insulating film. In the semiconductor layer, trenches extending between two neighboring source regions are formed, the inside surface of the trenches are covered by a gate insulating film, and the gate electrodes comprise surface-facing parts, which are buried in the trenches.

20 Claims, 35 Drawing Sheets

(56) References Cited

U.S. PATENT DOCUMENTS

| | | | |
|---|---|---|---|
| 5,686,750 A | 11/1997 | Takahashi | |
| 6,118,149 A | 9/2000 | Nakagawa et al. | |
| 2004/0183080 A1* | 9/2004 | Kusumoto et al. | 257/77 |
| 2005/0037559 A1 | 2/2005 | Osanai | |
| 2007/0045782 A1* | 3/2007 | Tanimoto | 257/653 |
| 2008/0203472 A1 | 8/2008 | Tamura | |
| 2009/0173997 A1 | 7/2009 | Fujihira et al. | |
| 2010/0019292 A1* | 1/2010 | Kim et al. | 257/288 |
| 2010/0032686 A1* | 2/2010 | Ishii et al. | 257/77 |
| 2010/0155836 A1* | 6/2010 | Hebert | 257/334 |
| 2010/0237356 A1* | 9/2010 | Haney et al. | 257/77 |

FOREIGN PATENT DOCUMENTS

| | | |
|---|---|---|
| JP | 5-347414 A | 12/1993 |
| JP | 11-103057 A | 4/1999 |
| JP | 2002-100771 A | 4/2002 |
| JP | 2003-168653 A | 6/2003 |
| JP | 2004-031471 A | 1/2004 |
| JP | 2005-056872 A | 3/2005 |
| JP | 2007/066959 A | 3/2007 |
| JP | 2008-210994 A | 9/2008 |
| JP | 2009-004574 A | 1/2009 |
| WO | WO-2007-046254 A1 | 4/2007 |

* cited by examiner

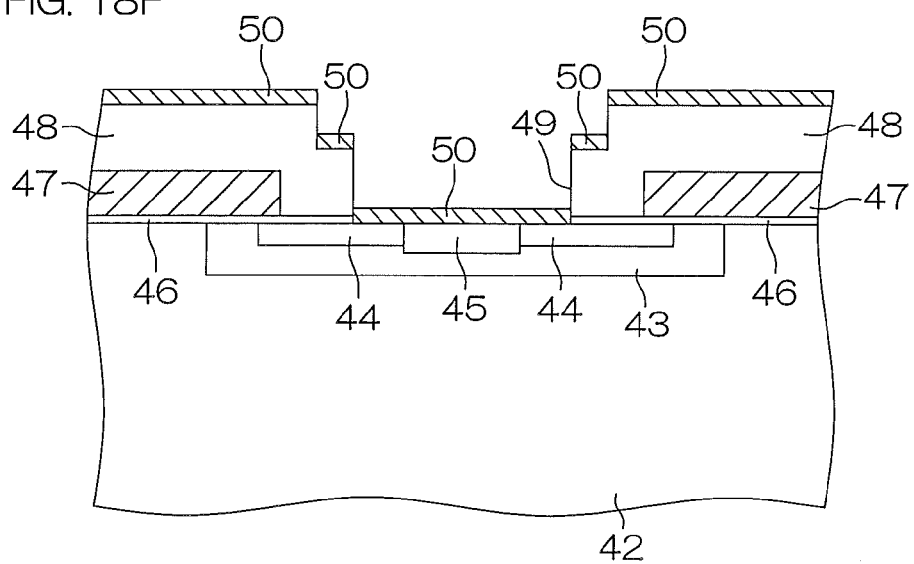
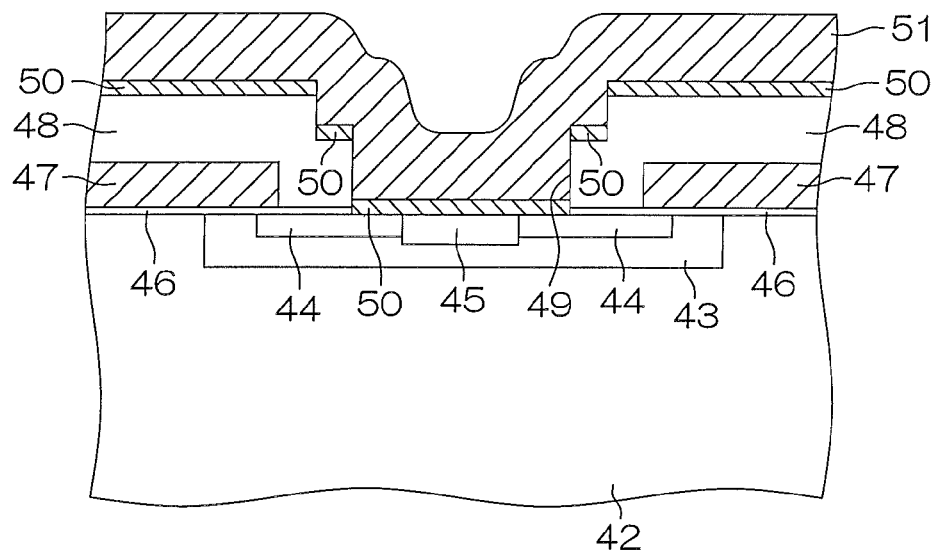

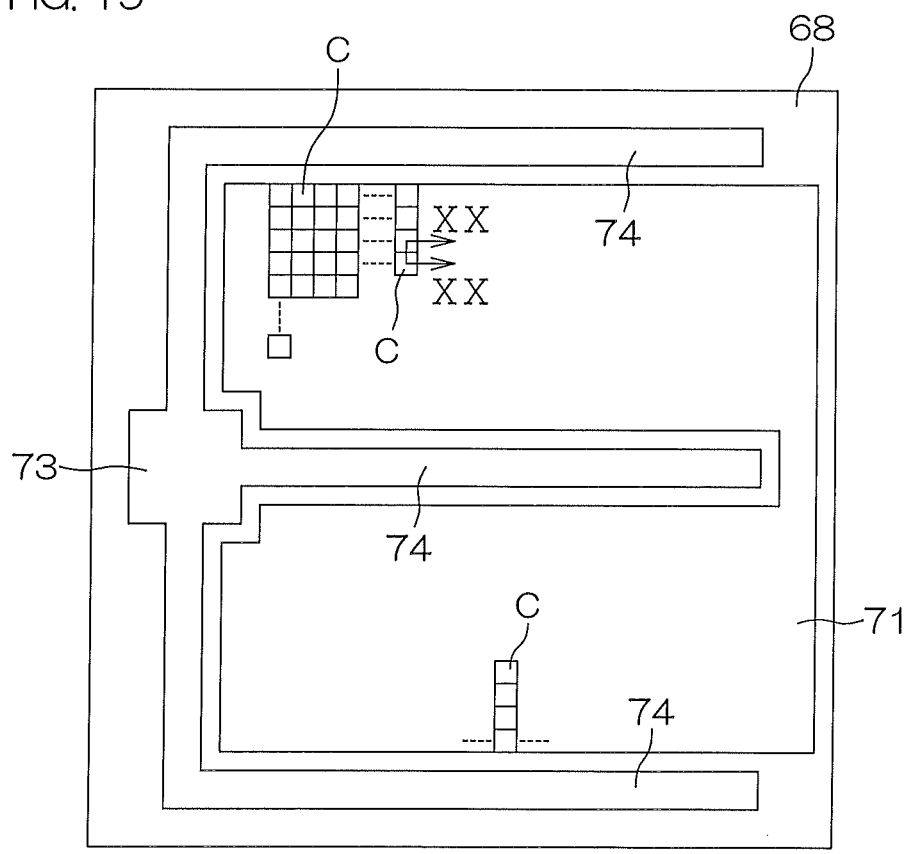

Al : 300keV/7E13cm$^{-2}$

Al : 300keV/6E13cm$^{-2}$

Al : 300keV/5E13cm$^{-2}$

Al : 300keV/4E13cm$^{-2}$

Al : 340keV/7E13cm$^{-2}$

Al : 340keV/6E13cm$^{-2}$

FIG. 34
| energy | Al 300keV | Al 340keV | Al 380keV | dose |
|---|---|---|---|---|
| Ron (Ω) | 0.479 | 0.403 | 0.383 | 7.E+13 cm-2 |
| | 0.441 | 0.401 | 0.371 | 6.E+13 cm-2 |
| | 0.382 | 0.357 | 0.340 | 5.E+13 cm-2 |
| | 0.367 | 0.349 | 0.327 | 4.E+13 cm-2 |
| Vth (V) | 3.73 | 3.22 | 2.95 | 7.E+13 cm-2 |
| | 3.51 | 3.09 | 2.88 | 6.E+13 cm-2 |
| | 3.23 | 2.90 | 2.67 | 5.E+13 cm-2 |
| | 3.07 | 2.76 | 2.57 | 4.E+13 cm-2 |
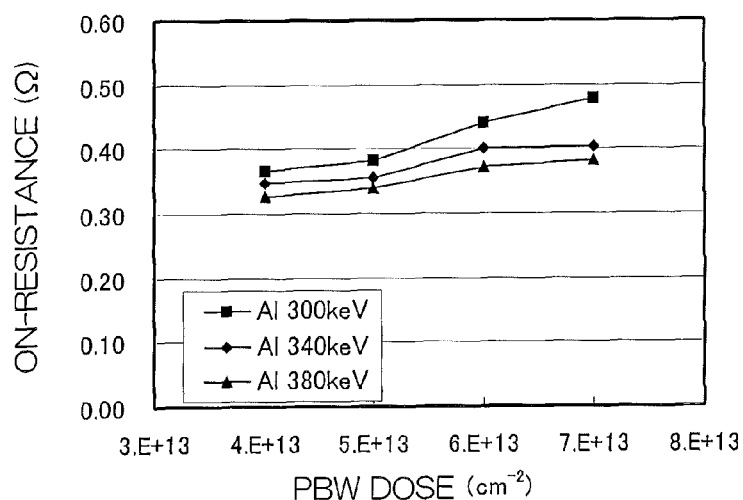
FIG. 35 RELATION BETWEEN PBW IMPLANTATION CONDITIONS AND ON-RESISTANCE
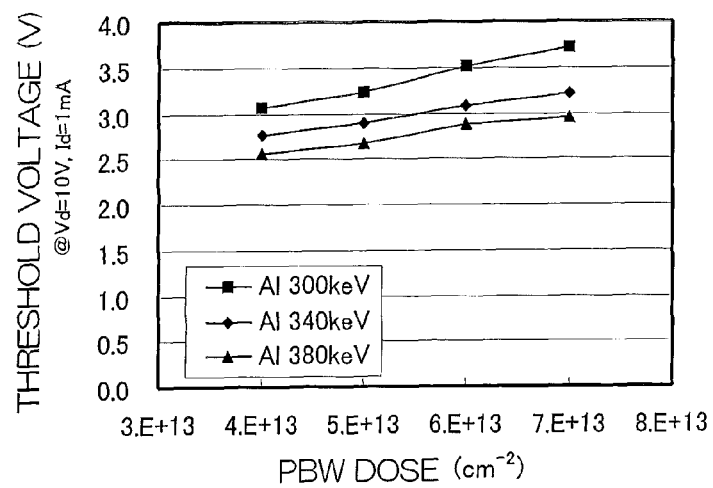
FIG. 36 RELATION BETWEEN PBW IMPLANTATION CONDITIONS AND THRESHOLD

SEMICONDUCTOR DEVICE

This is a Divisional of U.S. application Ser. No. 13/258,452, filed on Sep. 21, 2011, allowed on May 30, 2013, and issued on Oct. 1, 2013 as U.S. Pat. No. 8,546,814, which was a National Stage application of PCT/JP2010/054938, filed Mar. 23, 2010, the subject matters of which are incorporated herein by reference.

TECHNICAL FIELD

The present invention relates to a semiconductor device including a transistor.

BACKGROUND TECHNIQUE

An SiC (silicon carbide) semiconductor is excellent in dielectric breakdown resistance and heat conductivity, and watched with interest as a semiconductor suitable for application to an inverter or the like of a hybrid car.

For example, an inverter employing an SiC semiconductor has a MOSFET (Metal Oxide Semiconductor Field Effect Transistor). This type of SiC semiconductor device includes an SiC substrate and an N-type SiC epitaxial layer stacked on the SiC substrate. A plurality of P-type body regions (well regions) are formed on a surface layer portion of the SiC epitaxial layer at intervals from one another. An N-type source region is formed on a surface layer portion of each body region at an interval from a peripheral edge of the body region. A gate electrode made of N-type polysilicon (polysilicon doped with an N-type impurity) is formed on the SiC epitaxial layer. The gate electrode is opposed to a region (a channel region) between the peripheral edge of the body region and a peripheral edge of the source region through a gate oxide film. A $P^+$-type body contact region is formed on the inner side of the source region to pass through the source region in the depth direction.

An interlayer dielectric film is formed on the SiC epitaxial layer. The gate electrode is covered with the interlayer dielectric film. A source electrode is formed on the interlayer dielectric film. The source electrode is connected to the source region and the body contact region through a contact hole selectively formed in the interlayer dielectric film.

A voltage exceeding a threshold is applied to the gate electrode in a state where the source electrode is grounded and a positive voltage is applied to a drain electrode formed on the back surface of the SiC substrate, whereby a channel is formed in a portion close to the interface between the body regions and the gate oxide film, and a current flows between the source electrode and the drain electrode.

PRIOR ART

Patent Documents

Patent Document 1: Japanese Unexamined Patent Publication No. 2002-100771
Patent Document 2: Japanese Unexamined Patent Publication No. 2007-66959

SUMMARY OF THE INVENTION

Problems to be Solved by the Invention

In this type of semiconductor device, on-resistance of the MOSFET can be reduced by refining a cell pitch and gates. Following the refinement of the cell pitch, however, the interval between the body regions adjacent to each other is reduced, and a current path between the body regions is narrowed due to depletion layers spreading from the interfaces between the body regions and the SiC epitaxial layer (a drift region). Therefore, the so-called parasitic JFET resistance is increased. Hence, the reduction of the on-resistance by the refinement is limited.

In order to improve the on-resistance (channel mobility) of the MOSFET, the P-type impurity concentration in portions around the surfaces of the body regions where the channels are formed may be reduced. If the P-type impurity concentration in the portions around the surfaces of the body regions is reduced, however, a drain leakage current flowing between the source electrode and the drain electrode in a state where the MOSFET is off (gate voltage=0 V) is increased. In the conventional SiC semiconductor device, therefore, a drain leakage current of several 100 µA flows when the SiC semiconductor device reaches a high temperature of not less than 150° C.

If a metallic material (Al (aluminum), for example) for the source electrode is simply directly brought into contact with the surfaces of the source region and the body contact region, no ohmic contact can be attained, or the resistance (contact resistance) on the contact interfaces is remarkably high.

Therefore, the inventors study a technique of vapor-depositing an ohmic metal containing a key element (Ni (nickel), Al or the like, for example) on a source region and a body contact region, thereafter forming a reaction layer by performing a heat treatment (PDA: Post Deposition Anneal) at a high temperature of 1000° C. and forming a source electrode on the ohmic metal (the reaction layer), in order to attain low-resistance ohmic contact. However, the technique requires the heat treatment at the high temperature of 1000° C., and hence the manufacturing cost is increased.

An object of the present invention is to provide a semiconductor device capable of further reducing on-resistance beyond a limit of reduction of the on-resistance by refinement.

Another object of the present invention is to provide a semiconductor device capable of reducing both of the on-resistance and a drain leakage current.

Still another object of the present invention is to provide a semiconductor device capable of attaining low-resistance ohmic contact without performing a heat treatment.

Means for Solving the Problems

A semiconductor device according to the present invention for attaining the objects includes a semiconductor layer of a first conductivity type, a plurality of body regions of a second conductivity type formed on a region extending from the surface of the semiconductor layer to a halfway portion in the thickness direction at intervals in a direction orthogonal to the thickness direction, a source region of the first conductivity type formed on a surface layer portion of each body region at an interval from a peripheral edge of the body region, a gate insulating film formed on the semiconductor layer, and a gate electrode formed on the gate insulating film, while a trench extending over two source regions adjacent to each other is formed in the semiconductor layer by digging down the semiconductor layer from the surface thereof, the inner surface of the trench is covered with the gate insulating film, and the gate electrode has a surface-opposed portion opposed to the surface of the semiconductor layer and an embedded portion embedded in the trench.

In the semiconductor device, the potential (the gate potential) of the gate electrode is controlled in a state where a voltage is applied between the semiconductor layer (a drift region) and the source region, whereby a channel is formed in the vicinity of the interface between the semiconductor layer and the gate insulating film, and a current flows to the semiconductor layer.

The trench extending over the two source regions adjacent to each other is formed in the semiconductor layer. The inner surface of the trench is covered with the gate insulating film. The gate electrode has the surface-opposed portion opposed to the surface of the semiconductor layer through the gate insulating film and the embedded portion embedded in the trench. Therefore, channels are formed not only around the surface of the semiconductor layer, but also around the side surface and the bottom surface of the trench. Hence, the channel width can be enlarged as compared with a structure including a planar gate VDMISFET (Vertical Double diffused Metal Insulator Semiconductor Field Effect Transistor). Consequently, the on-resistance can be further reduced beyond the limit of the reduction of the on-resistance by refinement.

Preferably, a plurality of the trenches are formed. Thus, the channel width can be further enlarged.

The depth of the trench is preferably smaller than the depth of the body region, and further preferably smaller the depth of the source region. When the depth of the trench is smaller the depth of the source region, a channel is formed along the bottom surface of the trench, whereby the on-resistance can be further reduced.

The semiconductor layer may be an SiC epitaxial layer, and in this case, the surface of the SiC epitaxial layer is preferably a (0001) plane or a (000-1) plane of an SiC crystal.

Preferably, unit cells having the body regions and the source regions formed at the intervals from the peripheral edges of the body regions one by one are arranged in the form of a lattice in plan view. Preferably in this case, the trench is formed to expose the source regions of the unit cells adjacent to each other on the side surface, and the gate electrode is provided to extend over the two source regions facing each other in the trench.

Another semiconductor device for attaining the objects of the present invention includes an N-type semiconductor layer made of SiC, a P-type region selectively formed on a surface layer portion of the N-type semiconductor layer, an N-type region formed on a surface layer portion of the P-type region at an interval from a peripheral edge of the P-type region, a gate insulating film formed on the N-type semiconductor layer, and a gate electrode formed on the gate insulating film and opposed to a portion between the peripheral edge of the P-type region and the N-type region.

A threshold voltage is applied to the gate electrode in a state where a positive voltage is applied between the N-type region and a base layer portion of the N-type semiconductor layer, whereby a channel is formed in the vicinity of the interface between the P-type region and the gate insulating film, and a current (an ON-state current) flows between the N-type region and the N-type semiconductor layer.

In the semiconductor device according to the present invention, the P-type impurity concentration in the surface layer portion of the P-type region, more specifically, a portion of the P-type region having a depth of not more than 100 nm with reference to the center of the gate insulating film in the thickness direction is controlled to not more than $1\times10^{18}$ cm$^{-3}$. Thus, mobility (channel mobility) of electrons in the channel formed in the P-type region can be improved, and on-resistance of a MISFET (Metal Insulator Semiconductor Field Effect Transistor) constituted of the respective portions of the SiC semiconductor device can be reduced.

In a semiconductor device according to still another mode of the present invention, a P-type region is formed by single-stage ion implantation with implantation energy of not less than 300 keV and a dose of not less than $4\times10^{13}$ cm$^{-2}$. Thus, the P-type impurity concentration in a portion of the P-type region having a depth of not more than 100 nm with reference to the center of a gate insulating film in the thickness direction necessarily becomes not more than $1\times10^{18}$ cm$^{-3}$. Therefore, mobility of electrons in a channel formed in the P-type region can be improved, and on-resistance of a MISFET constituted of respective portions of an SiC semiconductor device can be reduced, similarly to the aforementioned semiconductor device.

In each of these SiC semiconductor devices, the gate electrode is made of P-type polysilicon (polysilicon doped with a P-type impurity). The work function of N-type polysilicon is about 4.1 eV. On the other hand, the work function of the P-type polysilicon is about 5.1 eV. Therefore, the P-type polysilicon is so employed as the material for the gate electrode that the threshold voltage of the MISFET can be increased by about 1 V as compared with a structure employing the N-type polysilicon. Consequently, a leakage current (a drain leakage current) flowing in the N-type semiconductor layer in a state where the MISFET is off can be reduced.

Preferably, the P-type polysilicon serving as the material for the gate electrode is polysilicon doped with B (boron) with a dose of not less than $5\times10^{14}$ cm$^{-2}$ and not more than $5\times10^{15}$ cm$^{-2}$. If the dose of B is less than $5\times10^{14}$ cm$^{-2}$, the sheet resistance of the gate electrode is excessively increased. If the dose of B exceeds $5\times10^{15}$ cm$^{-2}$, on the other hand, there is a possibility that B in the gate electrode diffuses into the gate insulating film to cause leakage between the gate electrode and the P-type region.

However, the sheet resistance of the P-type polysilicon is about 70Ω/□ to 100Ω/□ while the sheet resistance of the N-type polysilicon is about 20Ω/□ and hence a switching delay of the MISFET resulting from a gate signal delay may be caused in a case of employing a structure of extending the gate electrode made of the P-type polysilicon from a gate pad contributing to electric connection with an outer portion.

Therefore, the SiC semiconductor device preferably includes a gate finger formed on the N-type semiconductor layer, made of a metallic material, and electrically connected with the gate pad and the gate electrode. In other words, the gate pad and the gate electrode are preferably connected with each other through the gate finger made of the metallic material. Thus, the problem of the switching delay resulting from the gate signal delay can be avoided.

A further semiconductor device for attaining the objects of the present invention includes a semiconductor layer made of SiC, an N-type first impurity region selectively formed on a surface layer portion of the semiconductor layer, a P-type second impurity region selectively formed on the surface layer portion of the semiconductor layer to be adjacent to the first impurity region and to be surrounded by the first impurity region, and an ohmic metal formed over the first impurity region and the second impurity region, while a P-type impurity is contained in a surface layer portion of the second impurity region in excess of the solubility limit with respect to SiC.

The P-type impurity is contained in the surface layer portion of the second impurity region in a concentration exceeding the solubility limit with respect to SiC, whereby low-resistance ohmic contact can be obtained not only with respect to the N-type first impurity region, but also with respect to the P-type second impurity region, without performing a heat treatment after formation of the ohmic metal.

While the mechanism in which the low-resistance ohmic contact is obtained without a heat treatment is not clear, it is presumed that the P-type impurity is excessively contained in the surface layer portion of the second impurity region and hence silicification is caused by combination of the excess P-type impurity and Si (silicon) in SiC even if no heat treatment is performed.

No heat treatment is necessary for obtaining low-resistance ohmic contact, whereby the cost and the time required for manufacturing the semiconductor device can be reduced as compared with the conventional SiC semiconductor device.

In the semiconductor device, the P-type impurity is preferably contained in a portion of the second impurity region having a depth of 50 nm to 100 nm (500 Å to 1000 Å) from the surface in excess of the solubility limit with respect to SiC.

In a portion of the second impurity region having a depth of not less than 100 nm (1000 Å) from the surface, the P-type impurity is preferably contained in a quantity less than the solubility limit with respect to SiC. Even if the P-type impurity is excessively contained in the portion of the second impurity region having the depth of not less than 100 nm from the surface, the excess P-type impurity does not contribute to reduction of the contact resistance. Therefore, futileness caused by doping such a deep portion with the P-type impurity in a high concentration can be avoided, and the cost and the time required for manufacturing SiC can be further reduced.

The p-type impurity may be contained in the surface layer portion of the second impurity region in a quantity greater than $2 \times 10^{20}$ cm$^{-3}$. The P-type impurity is reliably excessively contained in the surface layer portion of the second impurity region, whereby low-resistance ohmic contact can be reliably obtained with respect to the second impurity region without performing a heat treatment.

Preferably, the second impurity region has an impurity concentration profile formed by multistage ion implantation. According to the multistage ion implantation, the P-type impurity can be easily implanted into the portion of the second impurity region having the depth of 50 nm to 100 nm from the surface in excess of the solubility limit with respect to SiC.

The P-type impurity may simply be group III atoms, and may be Al, for example.

Preferably, the concentration of the N-type impurity in a surface layer portion of the first impurity region is in the range of $1 \times 10^{20}$ cm$^{-3}$ to $5 \times 10^{20}$ cm$^{-3}$. The concentration is so controlled to such a value that low-resistance ohmic contact with respect to the N-type first impurity region can be reliably obtained. In this case, the concentration of the N-type impurity in the surface layer portion of the first impurity region preferably has a box-type impurity concentration profile.

The ohmic metal may have a single-layer structure made of one type of material selected from a group of Ti, TiN, Ni, Al, Ta, TaN, W and WN, or may have a multilayer structure obtained by stacking layers made of a plurality of types of materials selected from the group.

A further semiconductor device for attaining the objects of the present invention includes a semiconductor layer of a first conductivity type made of SiC, a second conductivity type region formed on a surface layer portion of the semiconductor layer at an interval in a direction orthogonal to the thickness direction of the semiconductor layer, a first impurity region of the first conductivity type formed on a surface layer portion of each second conductivity type region at an interval from a peripheral edge of the second conductivity type region, a second impurity region of a second conductivity type formed on a surface layer portion of each second conductivity type region to be surrounded by the first impurity region, a gate insulating film formed on the semiconductor layer, a gate electrode formed on the gate insulating film, opposed to a portion of the second conductivity region between the peripheral edge thereof and the first impurity region, and extending over two first impurity regions adjacent to each other, and an ohmic metal formed over the first impurity region and the second impurity region, while the impurity concentration in a portion of the second conductivity type region having a depth of not more than 100 nm with reference to the center of the gate insulating film in the thickness direction is not more than $1 \times 10^{18}$ cm$^{-3}$, a second conductivity type impurity is contained in a surface layer portion of the second impurity region in excess of the solubility limit with respect to SiC, a trench extending over two source regions adjacent to each other is formed in the semiconductor layer by digging down the semiconductor layer from the surface thereof, the inner surface of the trench is covered with the gate insulating film, and the gate electrode has a surface-opposed portion opposed to the surface of the semiconductor layer and an embedded portion embedded in the trench.

According to the structure, channels are formed not only around the surface of the semiconductor layer, but also around the side surface and the bottom surface of the trench. Therefore, on-resistance can be further reduced beyond a limit of reduction of the on-resistance by refinement. Further, the impurity concentration in the portion of the second conductivity type region having the depth of not more than 100 nm with reference to the center of the gate insulating film in the thickness direction is controlled to not more than $1 \times 10^{18}$ cm$^{-3}$. Thus, mobility (channel mobility) of electrons in a channel formed in the second conductivity type region can be improved, and on-resistance of a MISFET constituted of the respective portions of the SiC semiconductor device can be reduced. In addition, the P-type impurity is contained in the surface layer portion of the second impurity region in a concentration exceeding the solution limit with respect to SiC, whereby low-resistance ohmic contact can be obtained not only with respect to the first impurity region, but also with respect to the second impurity region, without performing a heat treatment after formation of the ohmic metal.

A further semiconductor device for attaining the objects of the present invention includes a semiconductor layer of a first conductivity type made of SiC, a second conductivity type region selectively formed on a surface layer portion of the semiconductor layer, a first impurity region of the first conductivity type formed on a surface layer portion of the second conductivity type region at an interval from a peripheral edge of the second conductivity region, a second impurity region of a second conductivity type formed on the surface layer portion of the second conductivity type region to be surrounded by the first impurity region, a gate insulating film formed on the semiconductor layer, a gate electrode formed on the gate insulating film and opposed to a portion of the second conductivity region between the peripheral edge thereof and the first impurity region, and an ohmic metal formed over the first impurity region and the second impurity region, while the impurity concentration in a portion of the second conductivity type region having a depth of not more than 100 nm with reference to the center of the gate insulating film in the thickness direction is not more than $1 \times 10^{18}$ cm$^{-3}$, and a second conductivity type impurity is contained in a surface layer portion of the second impurity region in excess of the solubility limit with respect to SiC.

According to the structure, the impurity concentration in the portion of the second conductivity type region having the depth of not more than 100 nm with reference to the center of the gate insulating film in the thickness direction is controlled to not more than $1\times10^{18}$ cm$^{-3}$. Thus, mobility (channel mobility) of electrons in a channel formed in the second conductivity type region can be improved, and on-resistance of a MISFET constituted of the respective portions of the SiC semiconductor device can be reduced. Further, the P-type impurity is contained in the surface layer portion of the second impurity region in the concentration exceeding the solution limit with respect to SiC, whereby low-resistance ohmic contact can be obtained not only with respect to the first impurity region, but also with respect to the second impurity region, without performing a heat treatment after formation of the ohmic metal.

BRIEF DESCRIPTION OF THE DRAWINGS

FIG. 18F is a schematic sectional view showing a step subsequent to FIG. 18E.

FIG. 18G is a schematic sectional view showing a step subsequent to FIG. 18F.

FIG. 19 is a schematic plan view of a semiconductor device according to a fourth embodiment of the present invention.

FIG. 34 is a table showing measurement results of on-resistance and threshold voltages in SiC semiconductor devices using structures according to Examples 1 to 12.

FIG. 35 is a graph showing measurement results of on-resistance in the SiC semiconductor devices using the structures according to Examples 1 to 12.

FIG. 36 is a graph showing measurement results of threshold voltages in the SiC semiconductor devices using the structures according to Examples 1 to 12.

MODE FOR CARRYING OUT THE INVENTION

Embodiments of the present invention are now described in detail with reference to the accompanying drawings.

Figure 1:
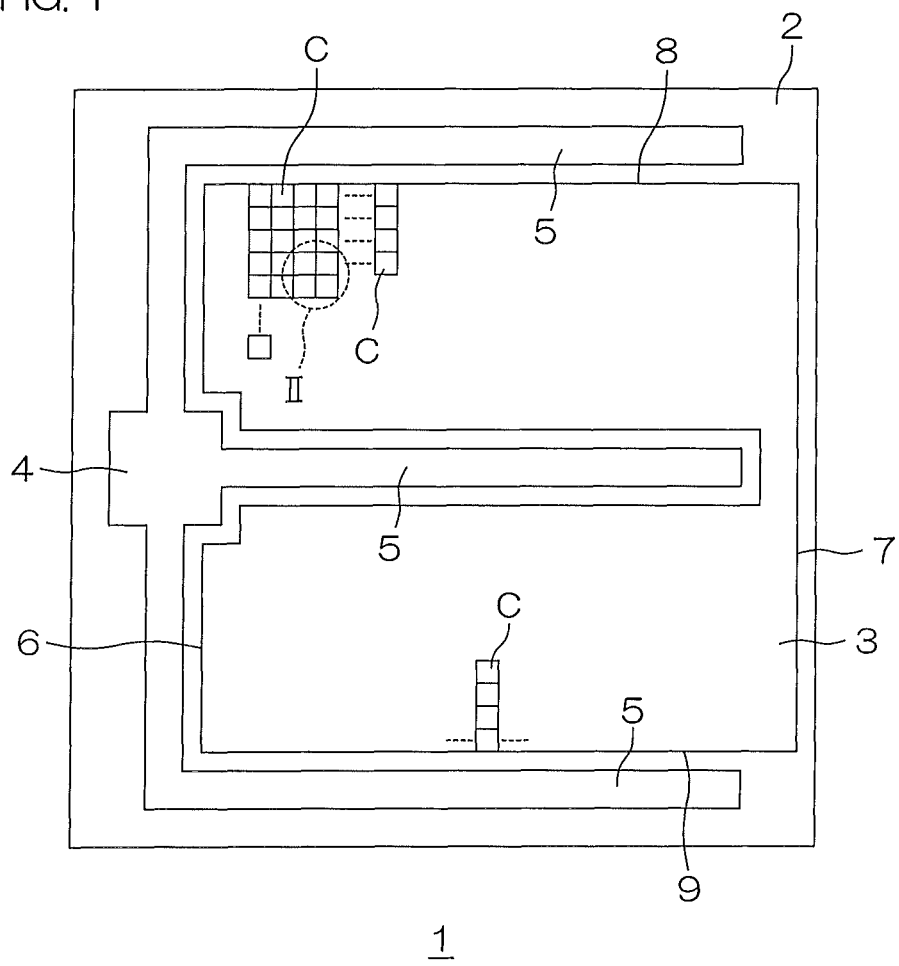
FIG. 1 is a schematic plan view of a semiconductor device according to a first embodiment of the present invention.

FIG. 1 is a schematic plan view of a semiconductor device according to a first embodiment of the present invention.

A semiconductor device 1 is formed in a square shape in plan view, and an interlayer dielectric film 2 is formed on a surface side thereof.

A source electrode 3, a gate pad 4 and gate fingers 5 are formed on the interlayer dielectric film 2.

The source electrode 3 is formed in a square shape in plan view having a region (a removed region 10) concavely removed in plan view from a first side edge 6 to the side of a second side edge 7 opposed to the first side edge 6 in a central portion thereof, and so arranged that the side edges are parallel to side edges of the semiconductor device 1 respectively.

The gate pad 4 is formed in a square shape in plan view, and provided around an open portion of the concave removed region 10 of the source electrode 3 in a noncontact manner at an interval with respect to the source electrode 3.

Three gate fingers 5 are formed integrally with the gate pad 4 in the embodiment. The three gate fingers 5 extend from the open side of the removed region 10 of the source electrode 3 toward the side opposite thereto one by one in the removed region 10 and outside a third side edge 8 and a fourth side edge 9 of the source electrode 3 orthogonal to the first side edge 6 parallelly to one another, and are provided in a noncontact manner at intervals with respect to the source electrode 3.

The gate pad 4 and the gate fingers 5 are made of the same metallic material. Preferably, the gate pad 4 and the gate fingers 5 are made of the same metallic material as the source electrode 3, such as a metallic material containing Al as a main component, for example. When the source electrode 3, the gate pad 4 and the gate fingers 5 are made of the same metallic material, the source electrode 3, the gate pad 4 and the gate fingers 5 can be formed by forming a film made of the metallic material on the whole area of the surface of the interlayer dielectric film 2 and patterning the film.

Under the source electrode 3, a large number of unit cells C of a VDMOSFET (Vertical Double diffused Metal Oxide Semiconductor Field Effect Transistor) consisting of respective portions described below are arranged and provided in the form of a matrix (in the form of a lattice) in plan view.

Figure 2:
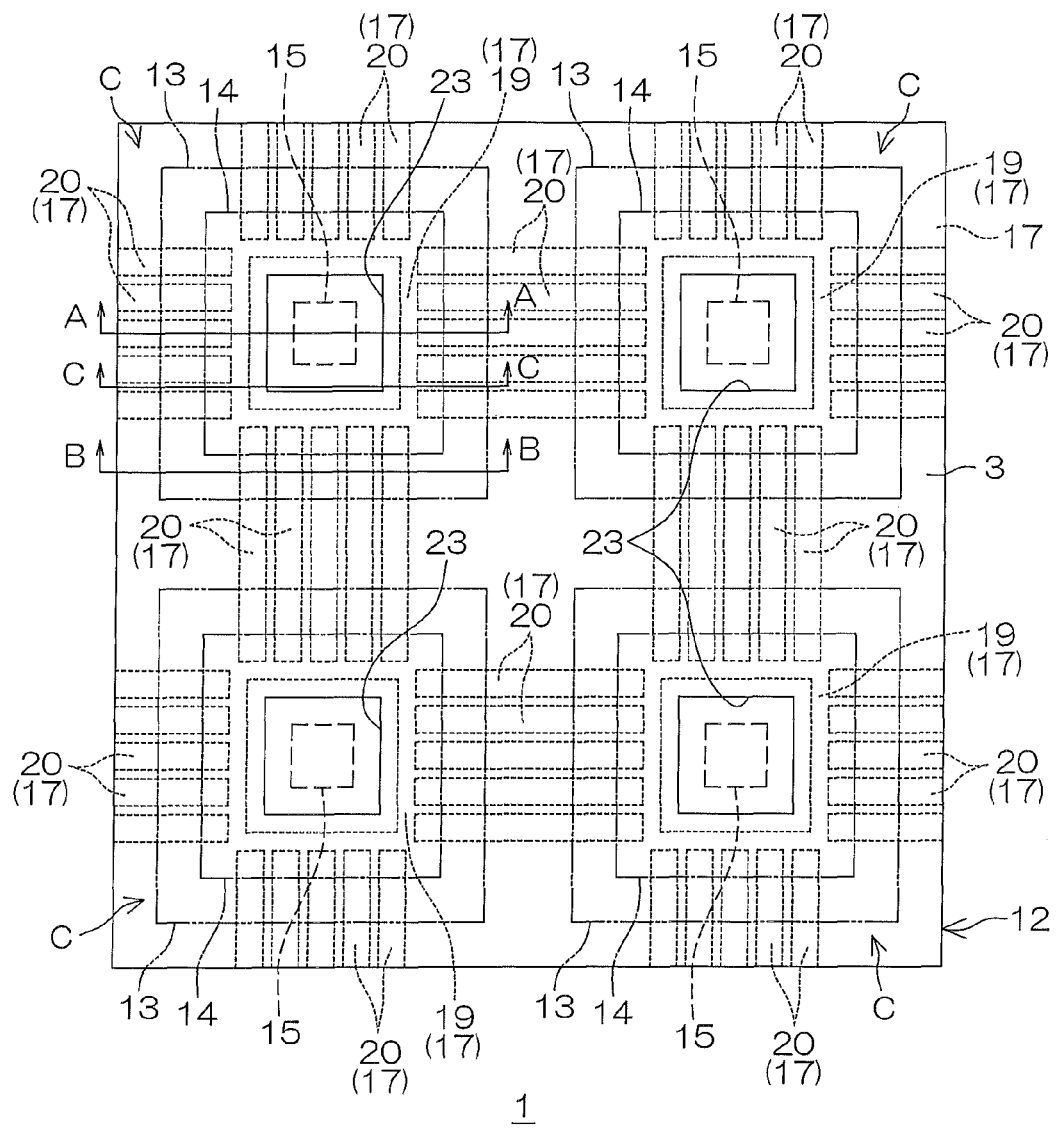
FIG. 2 is an enlarged view of a principal portion surrounded by a broken-line circle II in FIG. 1.
Figure 3A:
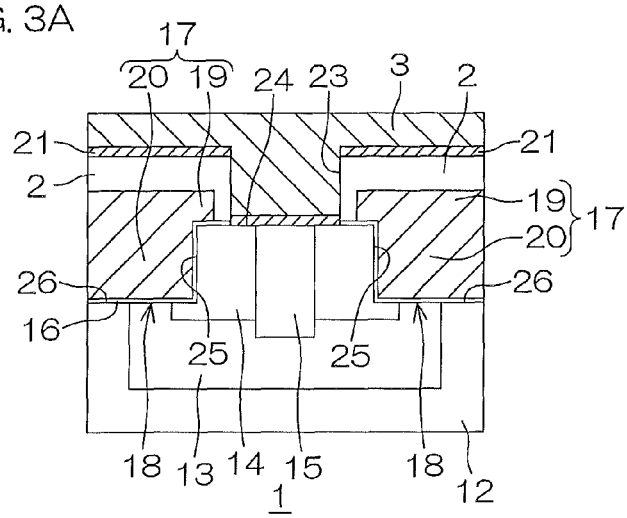
FIG. 3A is a schematic sectional view of the semiconductor device shown in FIG. 2 taken along a cutting plane line A-A.
Figure 3B:
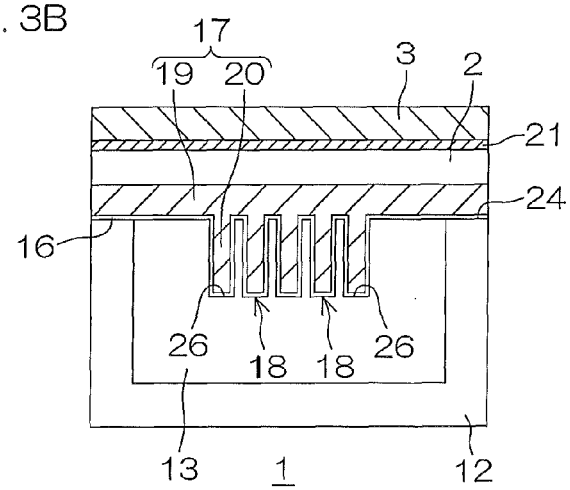
FIG. 3B is a schematic sectional view of the semiconductor device shown in FIG. 2 taken along a cutting plane line B-B.
Figure 3C:
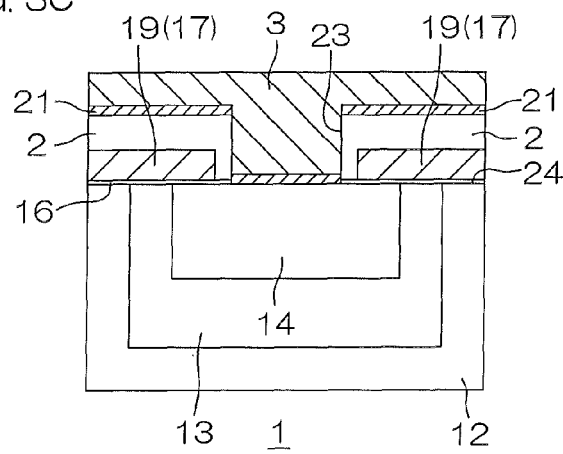
FIG. 3C is a schematic sectional view of the semiconductor device shown in FIG. 2 taken along a cutting plane line C-C.

FIG. 2 is an enlarged view of a principal portion surrounded by a broken-line circle II in FIG. 1, and four unit cells C are shown. FIG. 3A is a schematic sectional of the semiconductor device shown in FIG. 2 taken along a cutting plane line A-A. FIG. 3B is a schematic sectional view of the semiconductor device shown in FIG. 2 taken along a cutting plane line B-μ. FIG. 3C is a schematic sectional view of the semiconductor device shown in FIG. 2 taken along a cutting plane line C-C. In each sectional view, only portions made of conductive materials are hatched, in order to simplify the illustration.

The semiconductor device 1 includes an SiC epitaxial layer 12 stacked on an SiC substrate (not shown). The SiC epitaxial layer 12 is doped with an N-type impurity, thereby exhibiting an N conductivity type. In the embodiment, the thickness of the SiC epitaxial layer 12 is about 7 μm, and the N-type impurity concentration in the SiC epitaxial layer 12 is $1\times10^{16}$ cm$^{-3}$.

A plurality of body regions 13 are formed on a surface layer portion of the SiC epitaxial layer 12. Each body region 13 exhibits a P conductivity type, and is formed on a region extending from a surface 24 of the SiC epitaxial layer 12 to a halfway portion in the depth direction at an interval to another body region 13 in a direction orthogonal to the thickness direction of the SiC epitaxial layer 12. In the embodiment, the depth of the body region 13 is 5000 Å to 6500 Å (500 nm to 650 nm). The body region 13 is formed by single-stage ion implantation of Al which is a P-type impurity, and has such an impurity concentration profile that the P-type impurity concentration in a portion having a depth of not more than 1000 Å (100 nm) is not more than $1\times10^{18}$ cm$^{-3}$ with reference to the center of a gate insulating film 16 described later in the thickness direction.

A source region 14 is formed on a surface layer portion of each body region 13 at an interval from a peripheral edge of the body region 13. The source region 14 is doped with an N-type impurity in a higher concentration than the SiC epitaxial layer 12, to exhibit an N$^+$ conductivity type. In the embodiment, the depth of the source region 14 is about 2500 Å (250 nm). The source region 14 is formed by multistage ion implantation of P (phosphorus) which is the N-type impurity, and has such a box-type impurity concentration profile that the N-type impurity concentration in a portion having a depth of 100 Å to 2500 Å (10 nm to 250 nm) from the surface thereof is $1\times10^{20}$ cm$^{-3}$ to $5\times10^{20}$ cm$^{-3}$.

A body contact region 15 is formed on the inner side of each source region 14, to pass through the source region 14 in the depth direction. The body contact region 15 is doped with a P-type impurity in a higher concentration than the body region 13, to exhibit a P$^+$ conductivity type. In the embodiment, the depth of the body contact region 15 is about 3500 Å (350 nm). The body contact region 15 is formed by multistage ion implantation of Al which is the P-type impurity, and has such a box-type impurity concentration profile that the P-type impurity concentration in a portion having a depth of 500 Å to 1000 Å (50 nm to 100 nm) from the surface thereof is $2\times10^{20}$ cm$^{-3}$ to $5\times10^{20}$ cm$^{-3}$ and the P-type impurity concentration in a portion having a depth of not less than 1000 Å (100 nm) from the surface thereof is not more than $2\times10^{20}$ cm$^{-3}$. Thus, Al is contained in the portion of the body contact region 15 having the depth of 500 Å to 1000 Å from the surface in excess of the solution limit with respect to SiC, and Al is contained in the portion of the body contact region 15 having the depth of not less than 1000 Å from the surface thereof in a quantity less than the solution limit with respect to SiC.

The gate insulating film 16 is formed on the SiC epitaxial layer 12. The gate insulating film 16 is made of SiO$_2$ (silicon oxide), for example. The thickness of the gate insulating film 16 is about 400 Å (40 nm), for example.

A gate electrode 17 is formed on the gate insulating film 16. The gate electrode 17 is made of doped polysilicon (polysilicon doped with an N-type impurity or a P-type impurity), for example. The gate electrode 17 is provided over source regions 14 adjacent to each other. The gate electrode 17 is connected with the gate fingers 5 via through-holes (not shown) formed in the interlayer dielectric film 2.

Under the gate electrode 17, a plurality of trenches 18 are formed in the SiC epitaxial layer 12. Each trench 18 is formed over the source regions 14, to expose two source regions 14 of unit cells C adjacent to each other on side surfaces 25 thereof. Each trench 18 is formed by digging down the SiC epitaxial layer 12 from the surface 24 thereof up to a position shallower than the deepest portions of the source regions 14, and parallelly provided at a constant pitch. The gate insulating film 16 and the gate electrode 17 enter each trench 18. Thus, the inner surface of each trench 18 is covered with the gate insulating film 16, and the gate electrode 17 integrally has a surface-opposed portion 19 opposed to the surface 24 of the SiC epitaxial layer 12 and an embedded portion 20 embedded in each trench 18.

The interlayer dielectric film 2 is formed on the SiC epitaxial layer 12. The gate electrode 17 is covered with the interlayer dielectric film 2. The interlayer dielectric film 2 is made of SiO$_2$, for example.

In the interlayer dielectric film 2, a contact hole 23 is formed on a position opposed to each body contact region 15. Each contact hole 23 passes through the gate insulating film 16, and the whole area of the body contact region 15 and a portion of the source region 14 around the body contact region 15 face the inner portion of each contact hole 23.

An ohmic metal 21 having a multilayer structure obtained by stacking a Ti (titanium) layer and a TiN (titanium nitride) layer from below is formed on portions of the surfaces of the source region 14 and the body contact region 15 facing the inner portion of the contact hole 23 (on the bottom surface of the contact hole 23) and on the surface of the interlayer dielectric film 2.

A source electrode 3 is formed on the interlayer dielectric film 2 (on the ohmic metal 21). The source electrode 3 enters the contact hole 23 selectively formed in the interlayer dielectric film 2, and is connected to the source region 14 and the body contact region 15 through the ohmic metal 21. The source electrode 3 is made of a metal containing Al as a main component, for example.

On the other hand, a drain electrode is formed on the back surface (the surface opposite to the side provided with the SiC epitaxial layer 12) of the SiC substrate, although the drain electrode is not shown.

The potential (the gate potential) of the gate electrode 17 is controlled in a state where the source electrode 3 is grounded and a proper positive voltage is applied to the drain electrode, whereby a channel is formed in the vicinity of the interface between the SiC epitaxial layer 12 and the gate insulating film 16, and a current flows between the source electrode 3 and the drain electrode through the channel and the space between the body regions 13 adjacent to each other.

As described above, the plurality of trenches 18 are formed in the SiC epitaxial layer 12 so that each trench 18 extends over two source regions 14 adjacent to each other. The inner surface of each trench 18 is covered with the gate insulating film 16. The gate electrode 17 has the surface-opposed portion 19 opposed to the surface 24 of the SiC epitaxial layer 12 through the gate insulating film 16 and the embedded portion 20 embedded in the trench 18. Therefore, channels are formed not only around the surface 24 of the SiC epitaxial layer 12, but also around the side surfaces 25 and a bottom surface 26 of the trench 18. Hence, a channel width can be enlarged as compared with a structure including a planar gate VDMISFET. Consequently, on-resistance can be further reduced beyond a limit of reduction of the on-resistance by refinement.

When a (0001) plane or a (000-1) plane of an SiC crystal appears on the surface 24 of the SiC epitaxial layer 12, a (11-20) plane of the SiC crystal appears on part of the side surfaces 25 of the trench 18, whereby a channel is so formed around the part that high channel mobility can be exhibited.

The sheet resistance of P-type polysilicon is about 70Ω/□ to 100Ω/□ while the sheet resistance of N-type polysilicon is about 20Ω/□, and hence a switching delay of the MISFET resulting from a gate signal delay may be caused in a case of employing a structure of extending the gate electrode 17 made of P-type polysilicon from the gate pad 4.

The gate pad 4 and the gate electrode 17 are connected with each other through the gate fingers 5 made of the metallic material, whereby the problem of a switching delay resulting from a gate signal delay can be avoided.

Further, the body region 13 is formed by the single-stage ion implantation with implantation energy of not less than 300 keV and a dose of not less than $4\times10^{13}$ cm$^{-2}$. Thus, the P-type impurity concentration in a surface layer portion of the body region 13, more specifically, a portion of the body region 13 having a depth of not more than 1000 Å with reference to the center of the gate insulating film 16 in the thickness direction becomes not more than $1\times10^{18}$ cm$^{-3}$. The P-type impurity concentration in the surface layer portion of the body region 13 is so controlled to a low value of not more than $1\times10^{18}$ cm$^{-3}$ that mobility (channel mobility) of electrons in a channel formed in the body region 13 can be improved, and the on-resistance of the VDMOSFET can be reduced.

In the semiconductor device 1, the gate electrode 17 is made of the P-type polysilicon. The work function of the N-type polysilicon is about 4.1 eV. On the other hand, the work function of the P-type polysilicon is about 5.1 eV. Therefore, the P-type polysilicon is so employed as the material for the gate electrode 17 that the threshold voltage of the VDMOSFET can be increased by about 1V as compared with a structure employing the N-type polysilicon. Consequently, a drain leakage current flowing between the source electrode 3 and the drain electrode in a state where the MISFET is off can be reduced.

The P-type polysilicon serving as the material for the gate electrode 17 consists of P-type polysilicon doped with B with a dose in the range of $5 \times 10^{14}$ cm$^{-2}$ to $5 \times 10^{15}$ cm$^{-2}$. The dose is so set to not less than $5 \times 10^{14}$ cm$^{-2}$ that the sheet resistance of the gate electrode 17 can be prevented from excessive increase. Further, the dose is so set to not more than $5 \times 10^{15}$ cm$^{-2}$ that B in the gate electrode 17 can be prevented from diffusing into the gate insulating film 16, and occurrence of leakage between the gate electrode 17 and the body region 13 resulting from the diffusion can be prevented.

Al which is the P-type impurity is contained in a surface layer portion of the body contact region 15 in excess of the solution limit with respect to SiC.

The P-type impurity is contained in the surface layer portion of the body contact region 15 in a concentration exceeding the solution limit with respect to SiC, whereby low-resistance ohmic contact can be attained not only with respect to the N-type source region 14, but also with respect to the P-type body contact region 15, without performing a heat treatment after formation of the ohmic metal 21.

The semiconductor device 1 first requires no heat treatment for obtaining low-resistance ohmic contact, whereby the cost and the time required for manufacturing the same can be reduced as compared with the conventional SiC semiconductor device.

According to the embodiment, Al is contained in the portion of the body contact region 15 having the depth of 500 Å to 1000 Å from the surface in excess of the solution limit with respect to SiC, and Al is contained in the portion of the body contact region 15 having the depth of not less than 1000 Å from the surface in the quantity less than the solution limit with respect to SiC. Even if Al is excessively contained in the portion of the body contact region 15 having the depth of not less than 1000 Å from the surface, the excess Al does not contribute to reduction of the contact resistance. Therefore, futileness caused by doping such a deep portion with Al in a high concentration can be avoided, and the cost and the time required for manufacturing SiC can be further reduced.

The body contact region 15 is formed by the multistage ion implantation. According to the multistage ion implantation, the P-type impurity can be easily implanted into the portion of the body contact region 15 having the depth of 50 nm to 100 nm from the surface in excess of the solution limit with respect to SiC.

The N-type impurity concentration in the surface layer portion of the source region 14 is controlled in the range of $1 \times 10^{20}$ cm$^{-3}$ to $5 \times 10^{20}$ cm$^{-3}$, whereby low-resistance ohmic contact with respect to the N-type source region 14 can be reliably obtained.

FIGS. 4A to 12A, FIGS. 4B to 12B and FIGS. 4C to 12C are schematic sectional views successively showing manufacturing steps for the semiconductor device shown in FIG. 2. The cutting planes in FIGS. 4A to 12A are identical to the cutting plane in FIG. 3A. The cutting planes in FIGS. 4B to 12B are identical to the cutting plane in FIG. 3B. The cutting planes in FIGS. 4C to 12C are identical to the cutting plane in FIG. 3C.

Figure 4A:
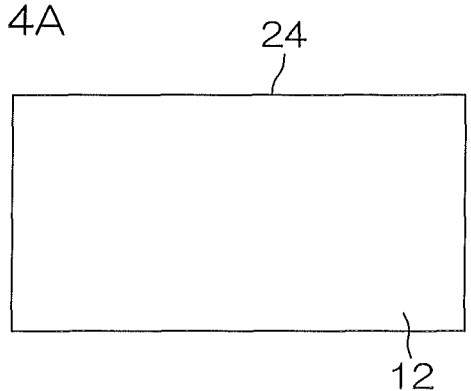
FIG. 4A is a schematic sectional view for illustrating a method of manufacturing the semiconductor device shown in FIG. 2, showing the same cutting plane as the cutting plane in FIG. 3A.
Figure 4B:
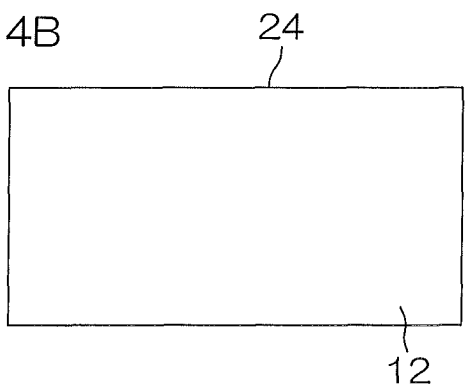
FIG. 4B is a schematic sectional view for illustrating the method of manufacturing the semiconductor device shown in FIG. 2, showing the same cutting plane as the cutting plane in FIG. 3B.
Figure 4C:
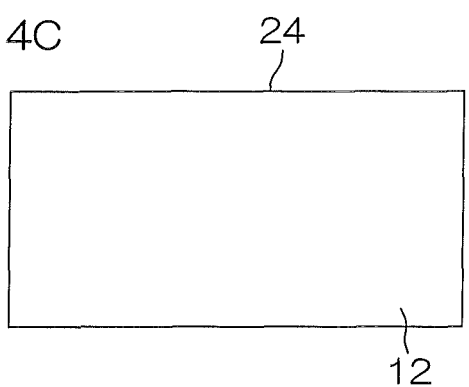
FIG. 4C is a schematic sectional view for illustrating the method of manufacturing the semiconductor device shown in FIG. 2, showing the same cutting plane as the cutting plane in FIG. 3C.

In the manufacturing steps for the semiconductor device 1, the SiC epitaxial layer 12 is first formed on the SiC substrate (not shown) by epitaxy, as shown in FIGS. 4A, 4B and 4C.

Figure 5A:
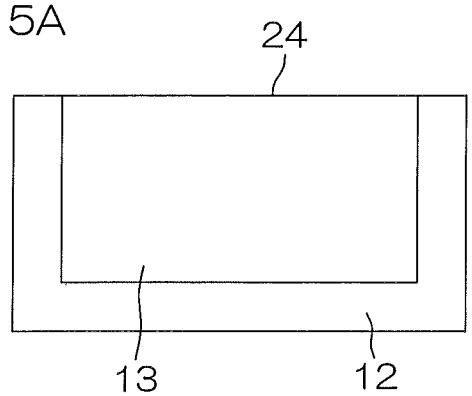
FIG. 5A is a schematic sectional view showing a step subsequent to FIG. 4A.
Figure 5B:
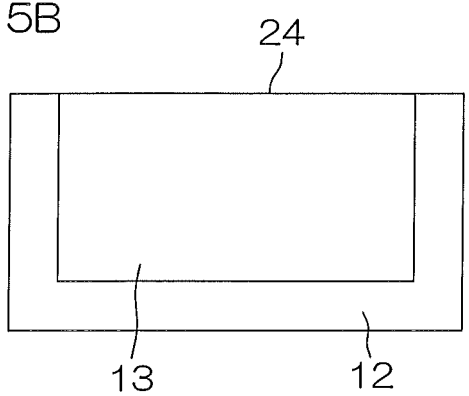
FIG. 5B is a schematic sectional view showing a step subsequent to FIG. 4B.
Figure 5C:
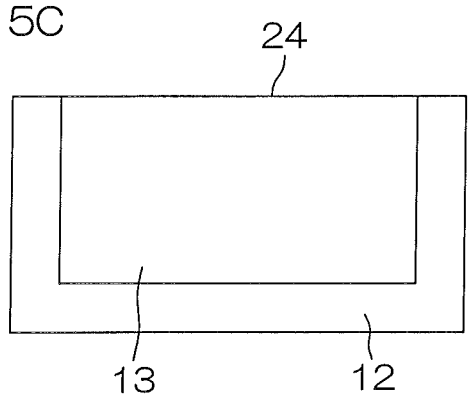
FIG. 5C is a schematic sectional view showing a step subsequent to FIG. 4C.

Then, the P-type impurity (Al, for example) for forming each body region 13 is selectively implanted into the surface layer portion of the SiC epitaxial layer 12 by single-stage ion implantation, as shown in FIGS. 5A, 5B and 5C.

Figure 6A:
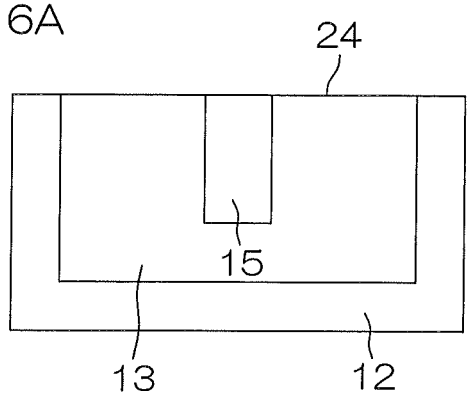
FIG. 6A is a schematic sectional view showing a step subsequent to FIG. 5A.
Figure 6B:
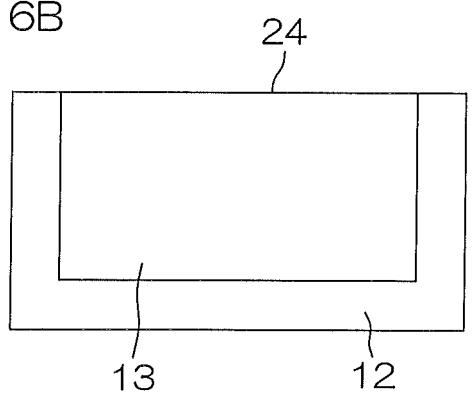
FIG. 6B is a schematic sectional view showing a step subsequent to FIG. 5B.
Figure 6C:
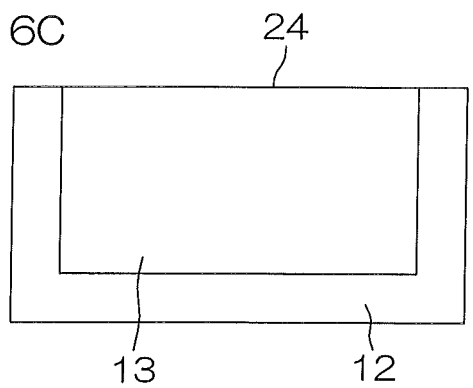
FIG. 6C is a schematic sectional view showing a step subsequent to FIG. 5C.

Then, Al which is the P-type impurity region for forming each body contact region 15 is selectively implanted into the surface layer portion of the body region 13 by multistage ion implantation (four-stage ion implantation, for example), as shown in FIGS. 6A, 6B and 6C.

Figure 7A:
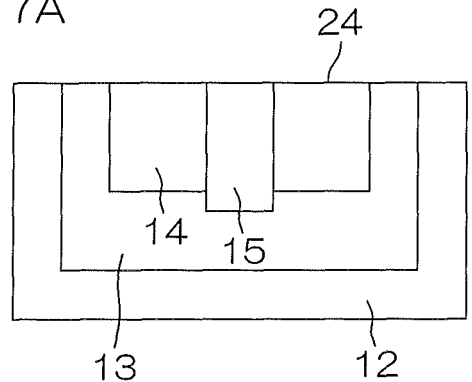
FIG. 7A is a schematic sectional view showing a step subsequent to FIG. 6A.
Figure 7B:
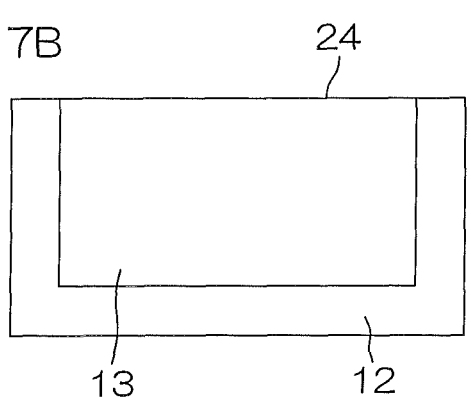
FIG. 7B is a schematic sectional view showing a step subsequent to FIG. 6B.
Figure 7C:
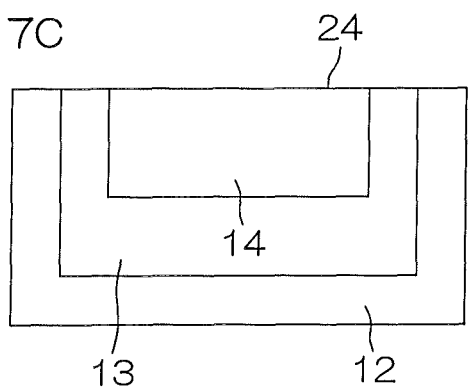
FIG. 7C is a schematic sectional view showing a step subsequent to FIG. 6C.

Then, P which is the N-type impurity for forming each source region 14 is selectively implanted into the surface layer portion of the body region 13 by multistage ion implantation (four-stage ion implantation, for example), as shown in FIGS. 7A, 7B and 7C.

Thereafter annealing at a high temperature (1750° C., for example) is performed, and the body region 13, the source region 14 and the body contact region 15 are formed on the surface layer portion of the SiC epitaxial layer 12.

Figure 8A:
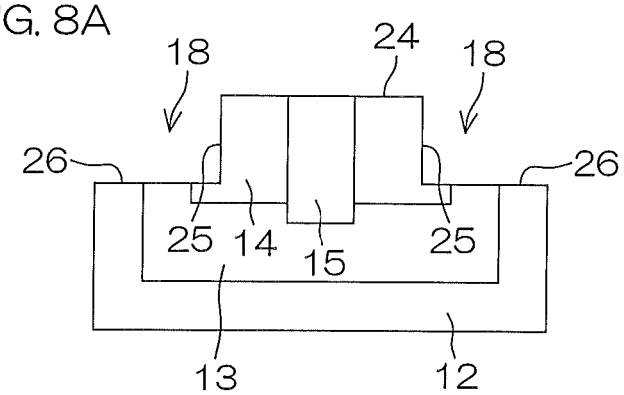
FIG. 8A is a schematic sectional view showing a step subsequent to FIG. 7A.
Figure 8B:
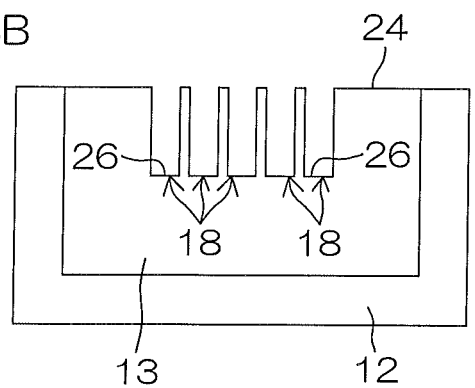
FIG. 8B is a schematic sectional view showing a step subsequent to FIG. 7B.
Figure 8C:
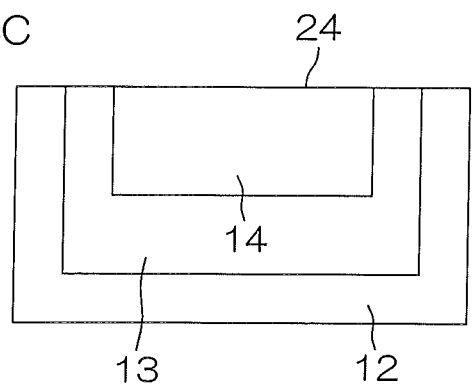
FIG. 8C is a schematic sectional view showing a step subsequent to FIG. 7C.

Thereafter the plurality of trenches 18 are formed in the SiC epitaxial layer 12 by photolithography and etching, as shown in FIGS. 8A, 8B and 8C.

Figure 9A:
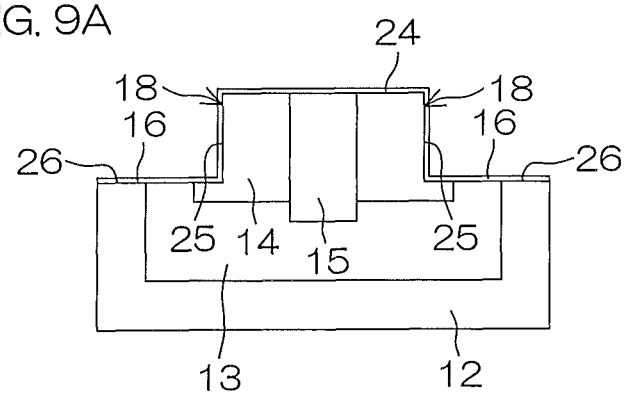
FIG. 9A is a schematic sectional view showing a step subsequent to FIG. 8A.
Figure 9B:
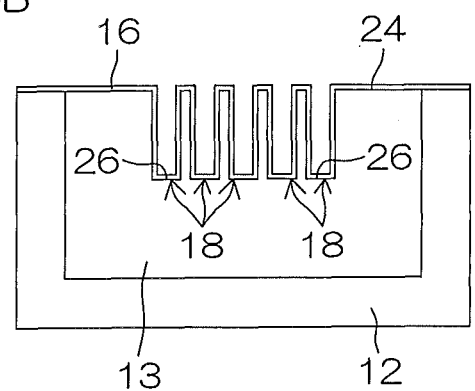
FIG. 9B is a schematic sectional view showing a step subsequent to FIG. 8B.
Figure 9C:
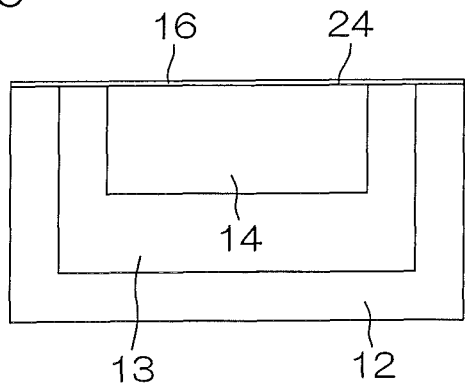
FIG. 9C is a schematic sectional view showing a step subsequent to FIG. 8C.

Then, the gate insulating film 16 is formed on the surface of the SiC epitaxial layer 12 by thermal oxidation, as shown in FIGS. 9A, 9B and 9C.

Heat treatments for activating the impurities, i.e., the P-type impurity and the N-type impurity may be individually performed after the implantation of the P-type impurity and after the implantation of the N-type impurity respectively, or may be performed after the P-type impurity and the N-type impurity are continuously implanted into the body region 13 and before the trenches 18 are formed, so far as the heat treatments are performed before the thermal oxidation (formation of the gate insulating film 16).

Figure 10A:
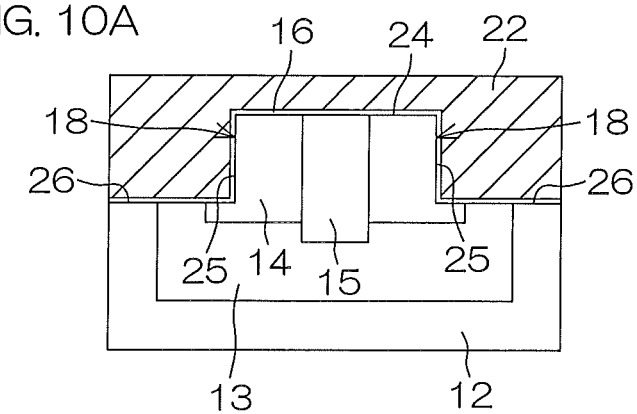
FIG. 10A is a schematic sectional view showing a step subsequent to FIG. 9A.
Figure 10B:
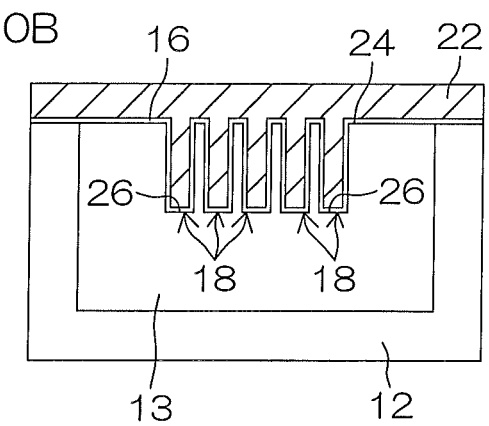
FIG. 10B is a schematic sectional view showing a step subsequent to FIG. 9B.
Figure 10C:
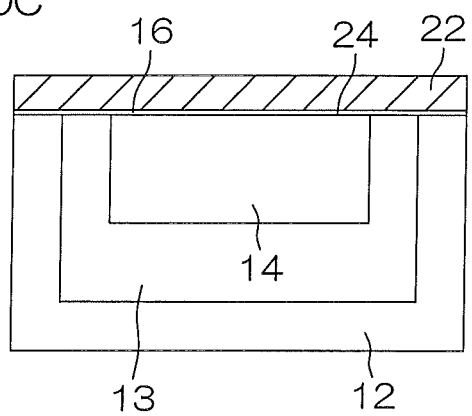
FIG. 10C is a schematic sectional view showing a step subsequent to FIG. 9C.

Thereafter doped polysilicon 22 is deposited on the gate insulating film 16 by CVD (Chemical Vapor Deposition) to fill up the trenches 18, as shown in FIGS. 10A, 10B and 10C.

Figure 11A:
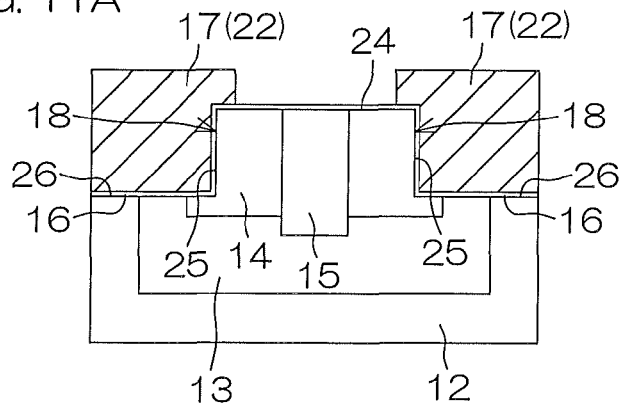
FIG. 11A is a schematic sectional view showing a step subsequent to FIG. 10A.
Figure 11B:
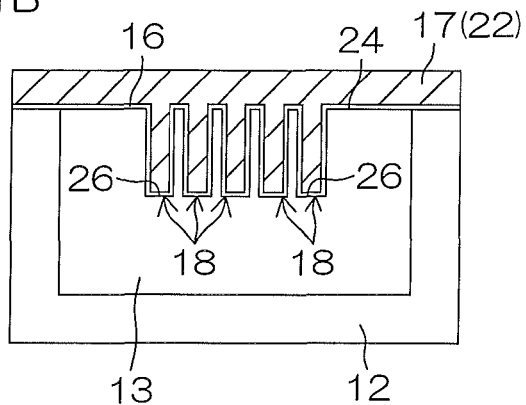
FIG. 11B is a schematic sectional view showing a step subsequent to FIG. 10B.
Figure 11C:
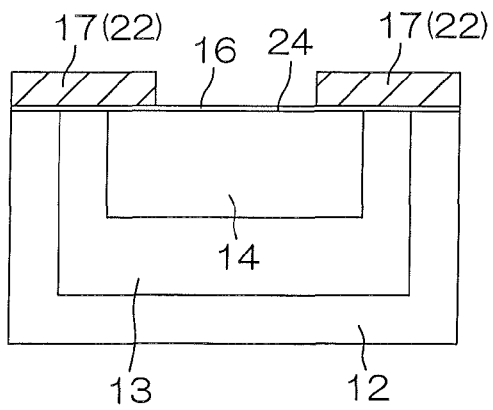
FIG. 11C is a schematic sectional view showing a step subsequent to FIG. 10C.

Then, the deposition layer of the doped polysilicon 22 is selectively removed by photolithography and etching, and the gate electrode 17 made of the doped polysilicon 22 is formed on the gate insulating film 16, as shown in FIGS. 11A, 11B and 11C.

Figure 12A:
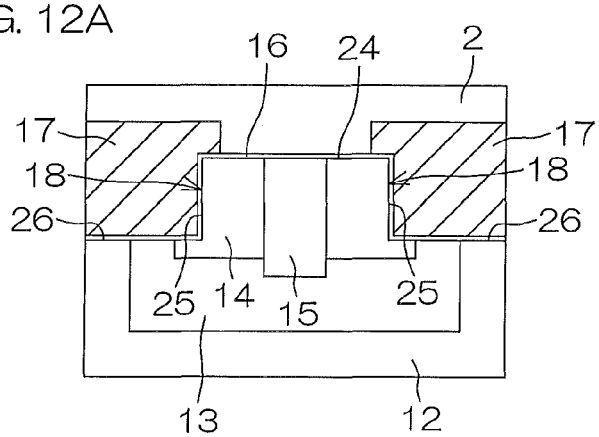
FIG. 12A is a schematic sectional view showing a step subsequent to FIG. 11A.
Figure 12B:
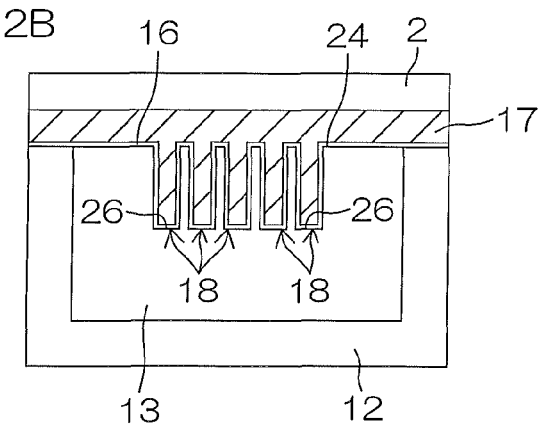
FIG. 12B is a schematic sectional view showing a step subsequent to FIG. 11B.
Figure 12C:
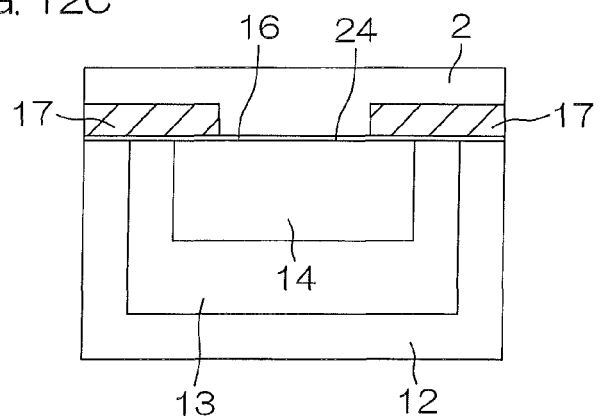
FIG. 12C is a schematic sectional view showing a step subsequent to FIG. 11C.

Thereafter the interlayer dielectric film 2 is formed on the SiC epitaxial layer 12 by CVD, as shown in FIGS. 12A, 12B and 12C.

Figure 13A:
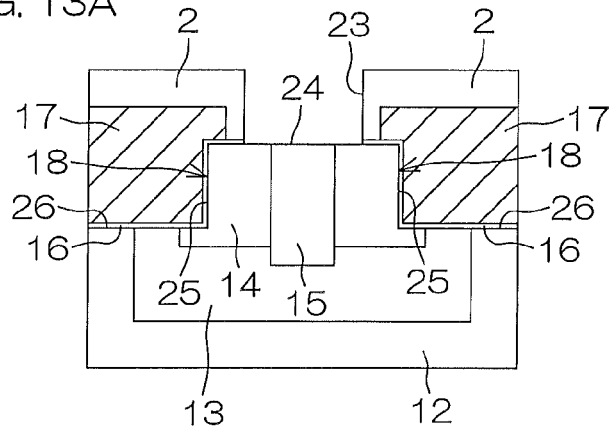
FIG. 13A is a schematic sectional view showing a step subsequent to FIG. 12A.
Figure 13B:
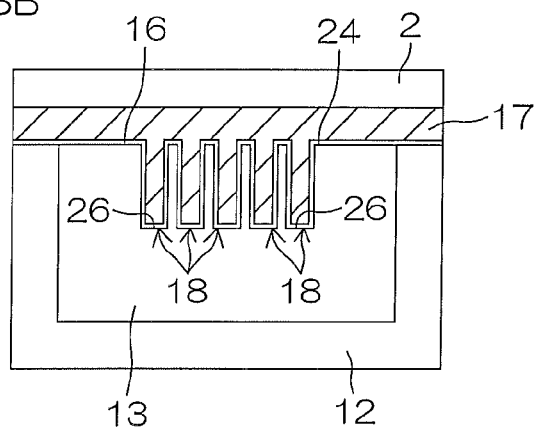
FIG. 13B is a schematic sectional view showing a step subsequent to FIG. 12B.
Figure 13C:
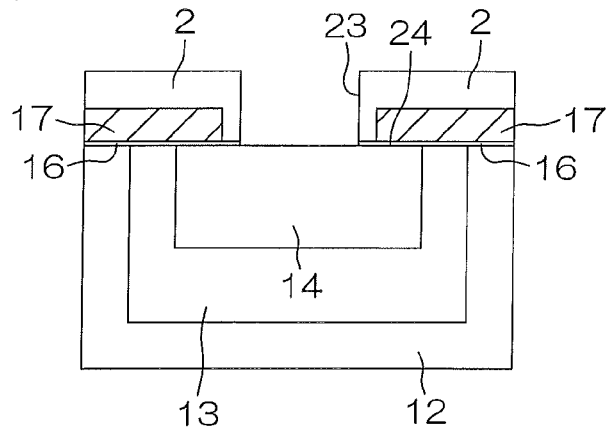
FIG. 13C is a schematic sectional view showing a step subsequent to FIG. 12C.

Then, the contact hole 23 is formed in the interlayer dielectric film 2 by photolithography and etching, as shown in FIGS. 13A, 13B and 13C.

Thereafter Ti and TiN are successively vapor-deposited on the portions of the surfaces of the source region 14 and the body contact region 15 facing the inner portion of the contact hole 23 (on the bottom surface of the contact hole 23) and on the surface of the interlayer dielectric film 2 by sputtering, whereby the ohmic metal 21 is formed.

Following the vapor deposition of Ti and TiN, the source electrode 3 is formed on the ohmic metal 21 by sputtering. Further, the drain electrode is formed on the back surface of the SiC substrate (not shown). Thus, the semiconductor device 1 shown in FIG. 2 is obtained.

Figure 14:
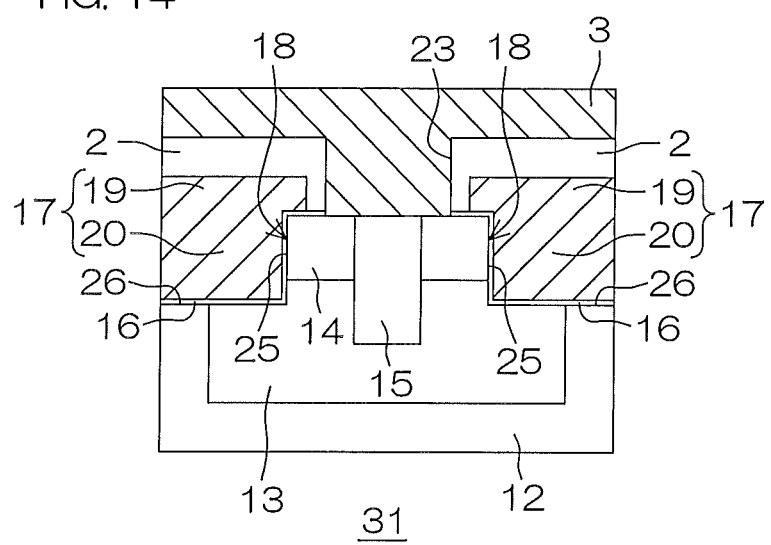
FIG. 14 is a schematic sectional view showing the structure of a semiconductor device according to a second embodiment of the present invention.

FIG. 14 is a schematic sectional view showing the structure of a semiconductor device according to a second embodiment of the present invention. Referring to FIG. 14, portions corresponding to the respective portions shown in FIG. 3A are denoted by the same reference numerals as the reference numerals assigned to the respective portions. In the following, only points different from the structure shown in FIG. 3A are described as to the structure shown in FIG. 14, and description of the portions denoted by the same reference numerals is omitted.

While the depth of the trench 18 is smaller than the depth of the source region 14 in the semiconductor device 1 shown in FIG. 3A, the depth of each trench 18 is larger than the depth of a source region 14 in a semiconductor device 31 shown in FIG. 14.

Also in the semiconductor device 31, channels are formed not only around a surface 24 of an SiC epitaxial layer 12, but also around side surfaces 25 and a bottom surface 26 of the trench 18. Therefore, on-resistance can be further reduced beyond a limit of reduction of the on-resistance by refinement.

In the case where the depth of the trench 18 is smaller than the depth of the source region 14, i.e., in the case of the structure shown in FIG. 3A, a channel is formed along the bottom surface 26 of the trench 18, and electrons moving in the channel linearly move along the respective ones of the side surfaces 25 and the bottom surface 26 of the trench 18. Therefore, the channel width can be increased, and further reduction of the on-resistance can be attained.

Figure 15:
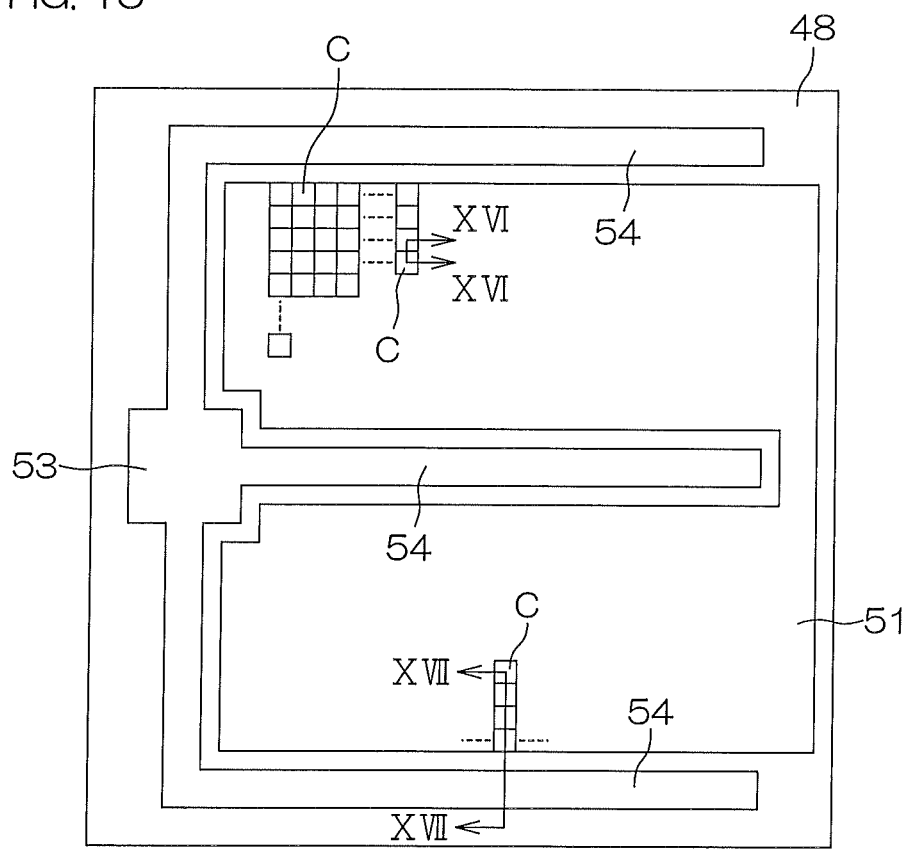
FIG. 15 is a schematic plan view of a semiconductor device according to a third embodiment of the present invention.
Figure 16:
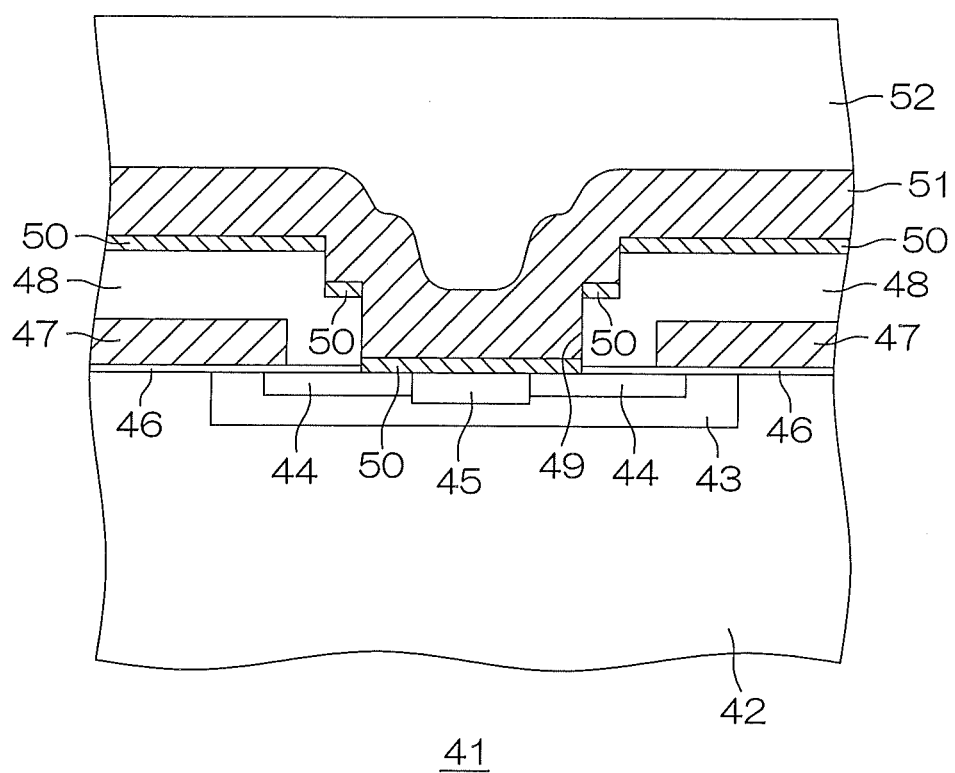
FIG. 16 is a schematic sectional view of the semiconductor device shown in FIG. 15 taken along a cutting plane line II-II.
Figure 17:
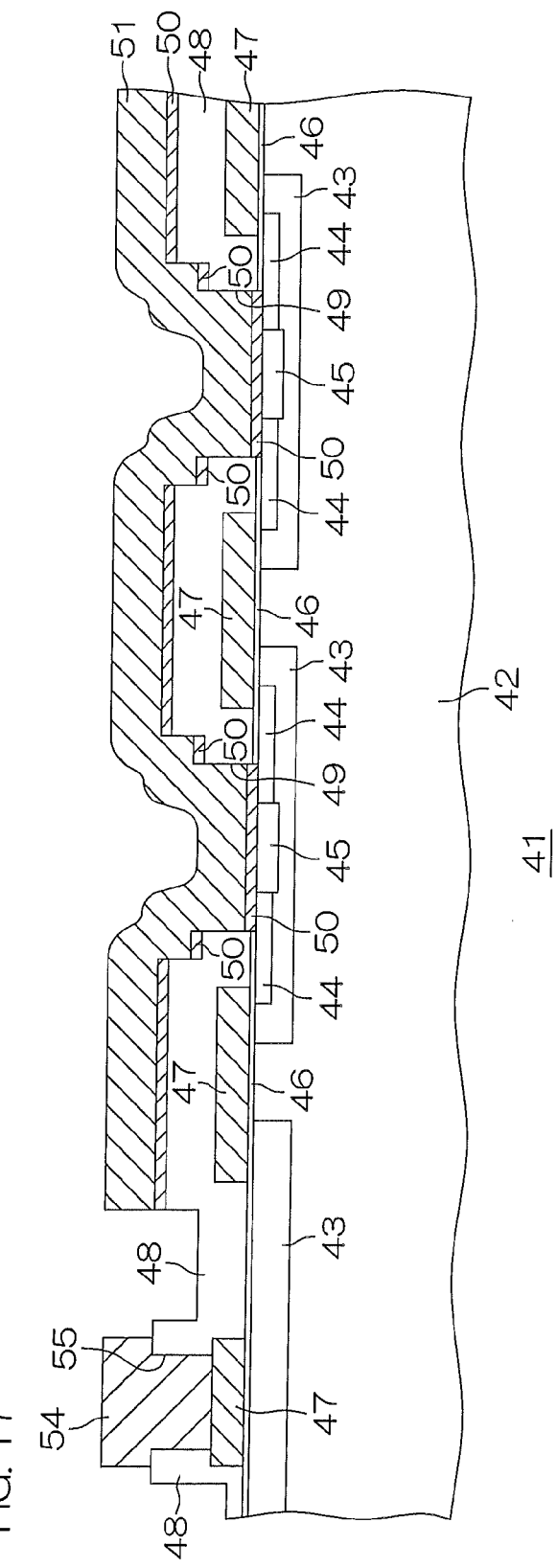
FIG. 17 is a schematic sectional view of the semiconductor device shown in FIG. 15 taken along a cutting plane line III-III.

FIG. 15 is a plan view of a semiconductor device according to a third embodiment of the present invention. FIG. 16 is a schematic sectional view of the semiconductor device shown in FIG. 15 taken along a cutting plane line II-II. FIG. 17 is a schematic sectional view of the semiconductor device shown in FIG. 15 taken along a cutting plane line III-III.

A semiconductor device 41 includes a plurality of cells C of a VDMOSFET (Vertical Double diffused Metal Oxide Semiconductor Field Effect Transistor) consisting of respective portions described below. As shown in FIG. 15, the plurality of cells C are arranged in the form of a matrix in plan view.

As shown in FIGS. 16 and 17, the semiconductor device 41 (SiC semiconductor device) includes an SiC epitaxial layer 42 stacked on an SiC substrate (not shown). The SiC epitaxial layer 42 is doped with an N-type impurity, to exhibit an N conductivity type. According to the embodiment, the thickness of the SiC epitaxial layer 42 is about 7 μm, and the N-type impurity concentration in the SiC epitaxial layer 42 is $1 \times 10^{16}$ cm$^{-3}$.

A plurality of body regions (well regions) 3 are parallelly formed on a surface layer portion of the SiC epitaxial layer 42. Each body region 43 exhibits a P conductivity type, and is formed to parallelly extend at a proper interval from another body region 43. In the embodiment, the depth of the body region 43 is 5000 Å to 6500 Å (500 nm to 650 nm). The body region 43 is formed by single-stage ion implantation of Al which is a P-type impurity, and has such an impurity concentration profile that the P-type impurity concentration in a portion having a depth of not more than 1000 Å (100 nm) with reference to the center of a gate insulating film 46 described later in the thickness direction is not more than $1 \times 10^{18}$ cm$^{-3}$.

A source region 44 is formed on a surface layer portion of each body region 43 at an interval from a peripheral edge of the body region 43. The source region 44 is doped with an N-type impurity in a higher concentration than the SiC epitaxial layer 42, to exhibit an N$^+$ conductivity type. In the embodiment, the depth of the source region 44 is about 2500 Å (250 nm).

A plurality of body contact regions 45 are formed on the inner side of the respective source regions 44 at a constant interval in a direction where the body region 43 extends. Each body contact region 45 is formed to pass through the source region 44 in the depth direction. Each body contact region 45 is doped with a P-type impurity in a higher concentration than the body region 43, to exhibit a P$^+$ conductivity type. In the embodiment, the depth of the body contact region 45 is about 3500 Å (350 nm).

A gate insulating film 46 is formed on the SiC epitaxial layer 42. The gate insulating film 46 is made of SiO$_2$ (silicon oxide), for example. The thickness of the gate insulating film 46 is about 400 Å (40 nm), for example.

A gate electrode 47 is formed on the gate insulating film 46. The gate electrode 47 is made of P-type polysilicon doped with B which is a P-type impurity with a dose in the range of $5 \times 10^{14}$ cm$^{-2}$ to $5 \times 10^{15}$ cm$^{-2}$. The gate electrode 47 is provided to extend over source regions 44 (body regions 43) adjacent to each other.

An interlayer dielectric film 48 is formed on the SiC epitaxial layer 42. The surface of the SiC epitaxial layer 42 is covered with the interlayer dielectric film 48, along with the gate electrode 47. The interlayer dielectric film 48 is made of SiO$_2$, for example.

In the interlayer dielectric film 48, a contact hole 49 is formed on a position opposed to each body contact region 45. Each contact hole 49 passes through the gate insulating film 46, and the whole area of the body contact region 45 and a portion of the source region 44 around the body contact region 45 face the inner portion of each contact hole 49.

An ohmic metal 50 having a multilayer structure obtained by stacking a Ti (titanium) layer and a TiN (titanium nitride) layer from below is formed on portions of the surfaces of the source region 44 and the body contact region 45 facing the inner portion of the contact hole 49 (on the bottom surface of the contact hole 49) and on the surface of the interlayer dielectric film 48.

A source electrode 51 is formed on the interlayer dielectric film 48 (the ohmic metal 50). The source electrode 51 enters each contact hole 49 formed in the interlayer dielectric film 48, and is connected to the source region 44 and the body contact region 45 through the ohmic metal 50. The source electrode 51 is made of a metallic material containing Al as a main component, for example.

A polyimide layer 52 is stacked on the source electrode 51, as shown in FIG. 16.

A drain electrode is formed on the back surface (the surface opposite to the side provided with the SiC epitaxial layer 42) of the SiC substrate, although the drain electrode is not shown.

The potential (the gate potential) of the gate electrode 47 is controlled in a state where the source electrode 51 is grounded and a proper positive voltage is applied to the drain electrode, whereby a channel is formed in the vicinity of the interface between the body region 43 and the gate insulating film 46, and a current flows between the source electrode 51 and the drain electrode.

As shown in FIG. 15, a gate pad 53 contributing to electric connection with an outer portion and gate fingers 54 extending from the gate pad 53 are formed on the interlayer dielectric film 48.

The gate pad 53 is arranged at the center of a portion along one side edge of the semiconductor device 41.

Three gate fingers 54 are provided, for example, and extend parallelly to one another between one side where the gate pad 53 is arranged and another side opposite thereto. An end portion on one side of each gate finger 54 is connected to the gate pad 53. The gate finger 54 is connected with the gate electrode 47 through a through-hole 55 (see FIG. 17) formed in the interlayer dielectric film 48.

The gate pad 53 and the gate fingers 54 are provided in a noncontact manner at intervals from the source electrode 51. In other words, the source electrode 51 is formed on a portion where the gate pad 53 and the gate fingers 54 are not formed on the interlayer dielectric film 48, at intervals from the gate pad 53 and the gate fingers 54.

The gate pad 53 and the gate fingers 54 are made of the same metallic material. Preferably, the gate pad 53 and the gate fingers 54 are made of the same metallic material as the source electrode 51, such as the metallic material containing Al as the main component, for example. When the source electrode 51, the gate pad 53 and the gate fingers 54 are made of the same metallic material, the source electrode 51, the gate pad 53 and the gate fingers 54 can be formed by forming a film made of the metallic material on the whole area of the surface of the interlayer dielectric film 48 and patterning the film.

The sheet resistance of P-type polysilicon is about 70Ω/☐ to 100Ω/☐ while the sheet resistance of N-type polysilicon is about 20Ω/☐, and hence a switching delay of a MISFET resulting from a gate signal delay may be caused in a case of employing a structure of extending the gate electrode 47 made of P-type polysilicon from the gate pad 53.

The gate pad 53 and the gate electrode 47 are connected with each other through the gate fingers 54 made of the metallic material, whereby the problem of the switching delay resulting from the gate signal delay can be avoided.

FIGS. 18A to 18G are schematic sectional views successively showing manufacturing steps for the semiconductor device shown in FIG. 16.

Figure 18A:
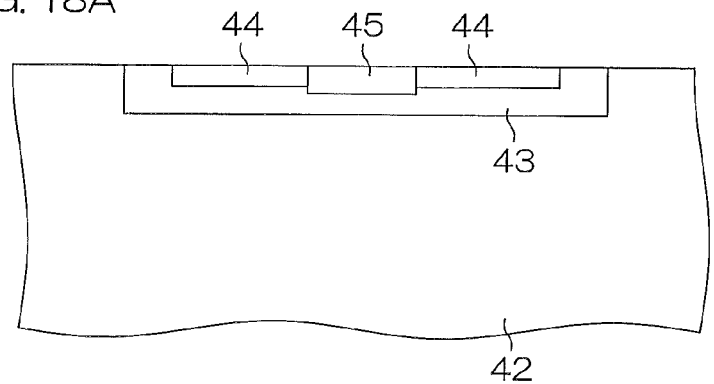
FIG. 18A is a schematic sectional view for illustrating a method of manufacturing the semiconductor device shown in FIG. 16.

In the manufacturing steps for the semiconductor device 41, the SiC epitaxial layer 42 is first formed on the SiC substrate (not shown) by epitaxy, as shown in FIG. 18A. Then, Al which is the P-type impurity for forming each body region 43 is selectively implanted into a surface layer portion of the SiC epitaxial layer 42 by single-stage implantation with implantation energy of not less than 300 keV and a dose of not less than $4\times10^{13}$ cm$^{-2}$. Then, P which is an N-type impurity for forming the source region 44 is selectively implanted into a surface layer portion of the body region 43 by multistage ion implantation (four-stage ion implantation, for example). Further, Al which is a P-type impurity for forming each body contact region 45 is selectively implanted into the surface layer portion of the body region 43 by multistage ion implantation (four-stage ion implantation, for example). Thereafter annealing at a high temperature (1750° C., for example) is performed, and the body region 43, the source region 44 and the body contact region 45 are formed on the surface layer portion of the SiC epitaxial layer 42.

Figure 18B:
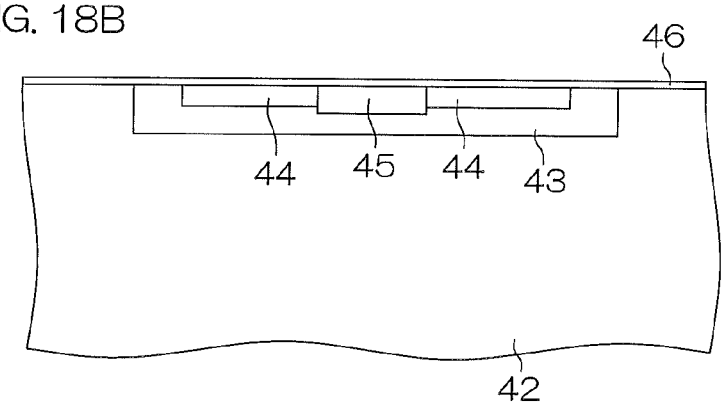
FIG. 18B is a schematic sectional view showing a step subsequent to FIG. 18A.

Then, the gate insulating film 46 is formed on the surface of the SiC epitaxial layer 42 by thermal oxidation, as shown in FIG. 18B.

Figure 18C:
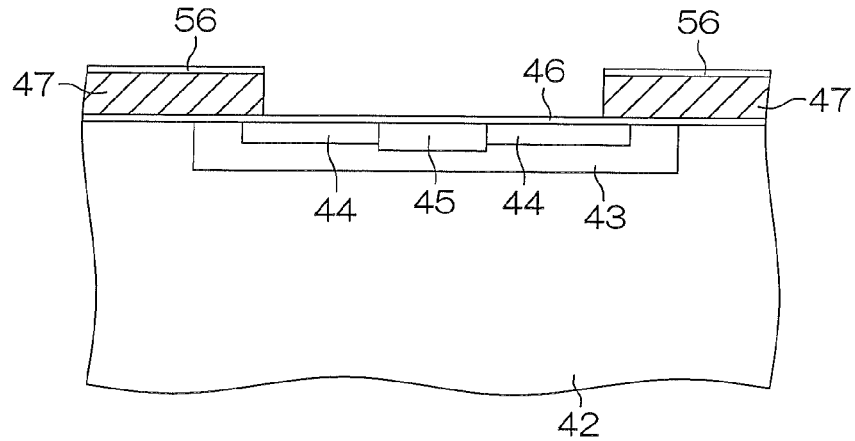
FIG. 18C is a schematic sectional view showing a step subsequent to FIG. 18B.

Thereafter polysilicon is deposited on the gate insulating film 46 by CVD (Chemical Vapor Deposition), as shown in FIG. 18C. Then, the deposition layer of the polysilicon is doped with B (boron) by ion implantation, in order to convert the deposition layer of the polysilicon to a deposition layer of P-type polysilicon. The doping with B is attained by ion implantation employing implantation energy of 30 keV and a dose of $2\times10^{15}$ cm$^{-2}$, for example. Then, the deposition layer of the P-type polysilicon is selectively removed by photolithography and etching, and the gate electrode 47 made of the P-type polysilicon is formed on the gate insulating film 46. In the process up to patterning of the gate electrode 47, a native oxide 56 made of SiO$_2$ is formed on the surface of the gate electrode 47.

Figure 18D:
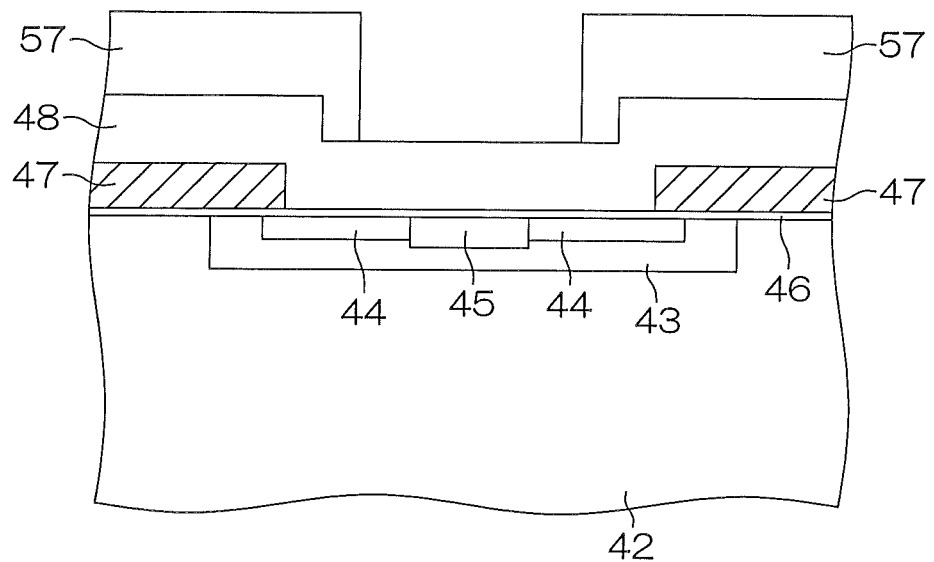
FIG. 18D is a schematic sectional view showing a step subsequent to FIG. 18C.

Then, the interlayer dielectric film 48 is formed on the SiC epitaxial layer 42 by CVD, as shown in FIG. 18D. The native oxide 56 on the surface of the gate electrode 47 integrates with the interlayer dielectric film 48. Thereafter a resist pattern 57 is formed on the interlayer dielectric film 48 by photolithography. The resist pattern 57 has an opening opposed to a portion of the interlayer dielectric film 48 for forming the contact hole 49.

Figure 18E:
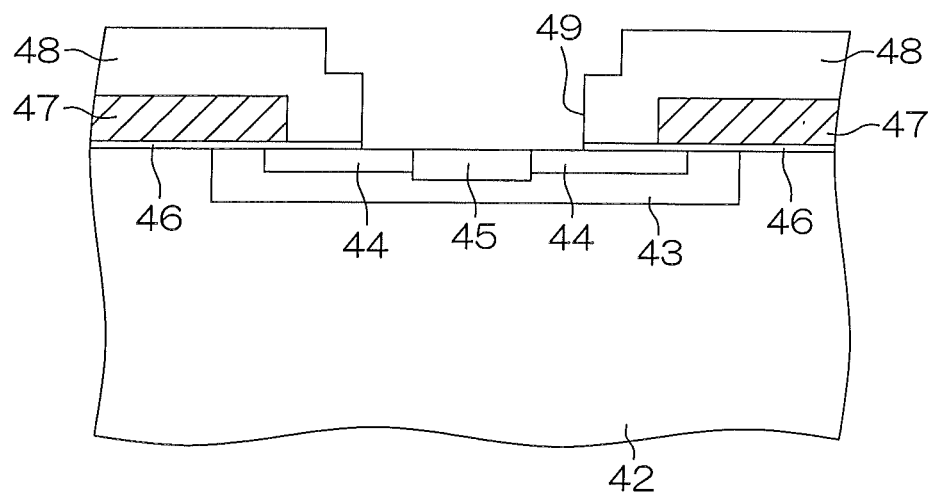
FIG. 18E is a schematic sectional view showing a step subsequent to FIG. 18D.

Thereafter the contact hole 49 is formed in the interlayer dielectric film 48 by etching employing the resist pattern 57 as a mask, as shown in FIG. 18E.

Then, films of Ti and TiN are successively formed on the portions of the surfaces of the source region 44 and the body contact region 45 facing the inner portion of the contact hole 49 (on the bottom surface of the contact hole 49) and on the surface of the interlayer dielectric film 48, whereby the ohmic metal 50 is formed, as shown in FIG. 18F.

Following the film formation (sputtering) of Ti and TiN, the source electrode 51 is formed on the ohmic metal 50 by sputtering, as shown in FIG. 18G. Thereafter photosensitive polyimide is applied onto the source electrode 51. After the photosensitive polyimide is selectively removed in order to expose part of the source electrode 51 as a pad, curing of the photosensitive polyimide is performed. Thus, the photosensitive polyimide forms the polyimide layer 52, and the semiconductor device 41 shown in FIG. 16 is obtained.

As hereinabove described, the semiconductor device 41 includes the SiC epitaxial layer 42, the body region 43 selectively formed on the surface layer portion of the SiC epitaxial layer 42, the source region 44 formed on the surface layer portion of the body region 43 at the interval from the peripheral edge of the body region 43, the gate insulating film 46 formed on the SiC epitaxial layer 42, and the gate electrode 47 formed on the gate insulating film 46 and opposed to a portion between the peripheral edge of the body region 43 and the source region 44.

The body region 43 is formed by the single-stage ion implantation with the implantation energy of not less than 300 keV and the dose of not less than $4\times10^{13}$ cm$^{-2}$. Thus, the P-type impurity concentration in the surface layer portion of the body region 43, more specifically, the portion of the body region 43 having the depth of not more than 1000 Å with reference to the center of the gate insulating film 46 in the thickness direction 46 becomes not more than $1\times10^{18}$ cm$^{-3}$. Mobility (channel mobility) of electrons in a channel formed in the body region 43 can be improved by controlling the P-type impurity concentration in the surface layer portion of the body region 43 to a low value of not more than $1\times10^{18}$ cm$^{-3}$, and on-resistance of the VDMOSFET can be reduced.

In the semiconductor device 41, the gate electrode 47 is made of the P-type polysilicon. The work function of the N-type polysilicon is about 4.1 eV. On the other hand, the work function of the P-type polysilicon is about 5.1 eV. Therefore, the P-type polysilicon is so employed as the material for the gate electrode 47 that the threshold voltage of the VDMOSFET can be increased by about 1 V as compared with a structure employing N-type polysilicon. Consequently, a drain leakage current flowing between the source electrode 51 and the drain electrode in a state where the MISFET is off can be reduced.

The P-type polysilicon serving as the material for the gate electrode 47 consists of P-type polysilicon doped with B with a dose in the range of $5\times10^{14}$ cm$^{-2}$ to $5\times10^{15}$ cm$^{-2}$ The dose is so set to not less than $5\times10^{14}$ cm$^{-2}$ that the sheet resistance of the gate electrode 47 can be prevented from excessive increase. Further, the dose is so set to not more than $5\times10^{15}$ cm$^{-2}$ that B in the gate electrode 47 can be prevented from diffusing into the gate insulating film 46, and occurrence of leakage between the gate electrode 47 and the body regions 43 resulting from the diffusion can be prevented.

Figure 20:
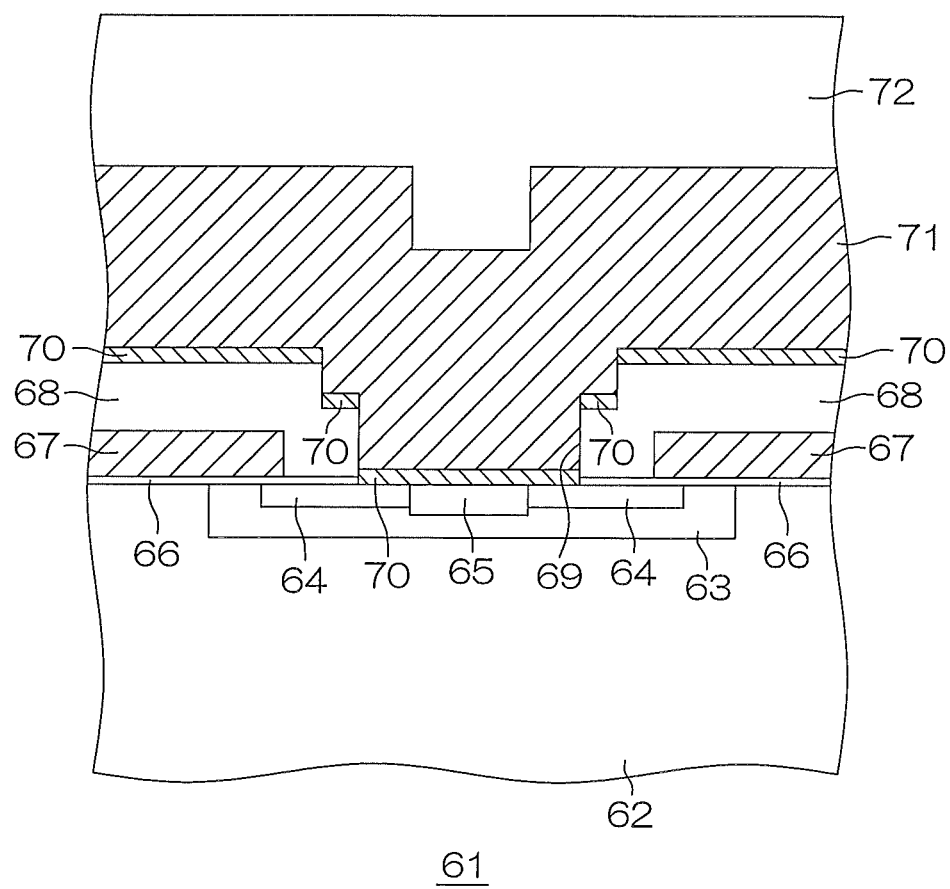
FIG. 20 is a schematic sectional view of the semiconductor device shown in FIG. 19 taken along a cutting plane line II-II.

FIG. 19 is a schematic plan view of a semiconductor device according to a fourth embodiment of the present invention. FIG. 20 is a schematic sectional view of the semiconductor device taken along a cutting plane line II-II shown in FIG. 19.

A semiconductor device 61 includes a plurality of cells C of a VDMOSFET (Vertical Double diffused Metal Oxide Semiconductor Field Effect Transistor) consisting of respective portions described below, as shown in FIG. 19. The plurality of cells C are arranged in the form of a matrix in plan view.

The semiconductor device 61 (SiC semiconductor device) includes an SiC epitaxial layer 62 stacked on an SiC substrate (not shown), as shown in FIG. 20. The SiC epitaxial layer 62 is doped with an N-type impurity, to exhibit an N conductivity type. In the embodiment, the thickness of the SiC epitaxial layer 62 is about 7 μm, and the N-type impurity concentration in the SiC epitaxial layer 62 is $1 \times 10^{16}$ cm$^{-3}$.

A plurality of body regions 63 are parallelly formed on a surface layer portion of the SiC epitaxial layer 62. Each body region 63 exhibits a P conductivity type, and is formed to parallelly extend at a proper interval from another body region 63. In the embodiment, the depth of the body region 63 is about 6500 Å (650 nm).

A source region 64 is formed on a surface layer portion of each body region 63 at an interval from a peripheral edge of the body region 63. The source region 64 is doped with an N-type impurity in a higher concentration than the SiC epitaxial layer 62, to exhibit an N$^+$ conductivity type. In the embodiment, the depth of the source region 64 is about 2500 Å (250 nm). The source region 64 is formed by multistage ion implantation of P (phosphorus) which is an N-type impurity, and has such a box-type impurity concentration profile that the N-type impurity concentration in portion having a depth of 100 Å to 2500 Å (10 nm to 250 nm) from the surface thereof is $1 \times 10^{20}$ cm$^{-3}$ to $5 \times 10^{20}$ cm$^{-3}$.

A plurality of body contact regions 65 are formed on the inner side of the respective source regions 64 at a constant interval in the direction where the body region 63 extends. Each body contact region 65 is surrounded by the source region 64 in plan view. Each body contact region 65 is formed to pass through the source region 64 in the depth direction. Each body contact region 65 is doped with a P-type impurity in a higher concentration than the body region 63, to exhibit a P$^+$ conductivity type. In the embodiment, the depth of the body contact region 65 is about 3500 Å (350 nm). The body contact region 65 is formed by multistage ion implantation of Al which is the P-type impurity, and has such a box-type impurity concentration profile that the P-type impurity concentration in a portion having a depth of 500 Å to 1000 Å (50 nm to 100 nm) from the surface thereof is $2 \times 10^{20}$ cm$^{-3}$ to $5 \times 10^{20}$ cm$^{-3}$ and the P-type impurity concentration in a portion having a depth of not less than 1000 Å (100 nm) from the surface is not more than $2 \times 10^{20}$ cm$^{-3}$. Thus, Al is contained in the portion of the body contact region 65 having the depth of 500 Å to 1000 Å from the surface in excess of the solution limit with respect to SiC, and Al is contained in the portion of the body contact region 65 having the depth of not less than 1000 Å from the surface in a quantity less than the solution limit with respect to SiC.

A gate insulating film 66 is formed on the SiC epitaxial layer 62. The gate insulating film 66 is made of SiO$_2$ (silicon oxide), for example.

A gate electrode 67 is formed on the gate insulating film 66. The gate electrode 67 is made of doped polysilicon (polysilicon doped with an N-type impurity or a P-type impurity), for example. The gate electrode 67 is provided to extend over source regions 64 (body regions 63) adjacent to each other.

An interlayer dielectric film 68 is formed on the SiC epitaxial layer 62. The surface of the SiC epitaxial layer 62 is covered with the interlayer dielectric film 68, along with the gate electrode 67. The interlayer dielectric film 68 is made of SiO$_2$, for example.

In the interlayer dielectric film 68, a contact hole 69 is formed on a position opposed to each body contact region 65. Each contact hole 69 passes through the gate insulating film 66, and the whole area of the body contact region 65 and a portion of the source region 64 around the body contact region 65 face the inner portion of each contact hole 69.

An ohmic metal 70 having a multilayer structure obtained by stacking a Ti (titanium) layer and a TiN (titanium nitride) layer from below is formed on portions of the surfaces of the source region 64 and the body contact region 55 facing the inner portion of the contact hole 69 (on the bottom surface of the contact hole 69) and on the surface of the interlayer dielectric film 68.

A source electrode 71 is formed on the interlayer dielectric film 68 (the ohmic metal 70). The source electrode 71 enters each contact hole 69 formed in the interlayer dielectric film 68, and is connected to the source region 64 and the body contact region 65 through the ohmic metal 70. The source electrode 71 is made of a metal containing Al as a main component, for example.

A polyimide layer 72 is stacked on the source electrode 71.

A drain electrode is formed on the back surface (the surface opposite to the side provided with the SiC epitaxial layer 62) of the SiC substrate, although the drain electrode is not shown.

The potential (the gate potential) of the gate electrode 67 is controlled in a state where the source electrode 71 is grounded and a proper positive voltage is applied to the drain electrode, whereby a channel is formed in the vicinity of the interface between the body region 63 and the gate insulating film 66, and a current flows between the source electrode 71 and the drain electrode.

As shown in FIG. 19, a gate pad 73 contributing to electric connection with an outer portion and gate fingers 64 extending from the gate pad 73 are formed on the interlayer dielectric film 68.

The gate pad 73 is arranged at the center of a portion along one side edge of the semiconductor device 61.

Three gate fingers 74 are provided, for example, and extend parallelly to one another between one side where the gate pad 73 is arranged and another side opposite thereto. An end portion on one side of each gate finger 74 is connected to the gate pad 73. The gate finger 74 is connected with the gate electrode 67 through a through-hole (not shown) formed in the interlayer dielectric film 68.

The gate pad 73 and the gate fingers 74 are provided in a noncontact manner at intervals from the source electrode 71. In other words, the source electrode 71 is formed on a portion where the gate pad 73 and the gate fingers 74 are not formed on the interlayer dielectric film 68, at intervals from the gate pad 73 and the gate fingers 74.

The gate pad 73 and the gate fingers 74 are made of the same metallic material. Preferably, the gate pad 73 and the gate fingers 74 are made of the same metallic material as the source electrode 71, such as a metallic material containing Al as a main component, for example. When the source electrode 71, the gate pad 73 and the gate fingers 74 are made of the same metallic material, the source electrode 71, the gate pad 73 and the gate fingers 74 can be formed by forming a film made of the metallic material on the whole area of the surface of the interlayer dielectric film 88 and patterning the film.

FIGS. 21A to 21G are schematic sectional views successively showing manufacturing steps for the semiconductor device shown in FIG. 20.

Figure 21A:
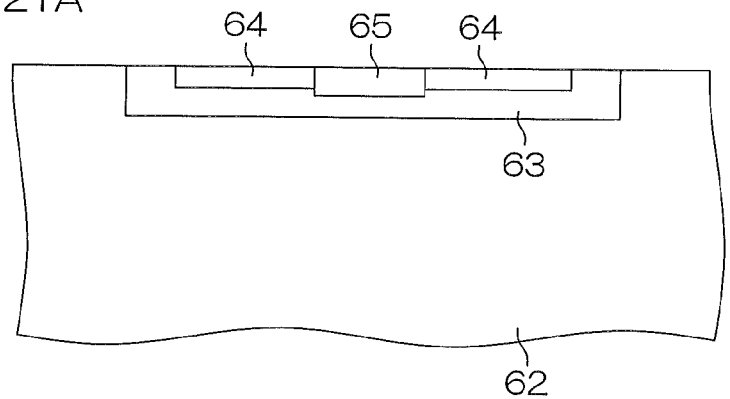
FIG. 21A is a schematic sectional view for illustrating a method of manufacturing the semiconductor device.

In the manufacturing steps for the semiconductor device 61, the SiC epitaxial layer 62 is first formed on the SiC substrate (not shown) by epitaxy, as shown in FIG. 21A. Then, a P-type impurity (Al, for example) for forming the body region 63 is selectively implanted into a surface layer portion of the SiC epitaxial layer 62 by single-stage ion implantation. Then, P which is the N-type impurity for forming the source region 64 is selectively implanted into a surface layer portion of the body region 63 by multistage ion implantation (four-stage ion implantation, for example). Further, Al which is the P-type impurity for forming the body contact region 65 is selectively implanted into the surface layer portion of the body region 63 by multistage ion implantation (four-stage ion implantation, for example). Thereafter annealing at a high temperature (1750° C., for example) is performed, and the body region 63, the source region 64 and the body contact region 65 are formed on the surface layer portion of the SiC epitaxial layer 62.

Figure 21B:
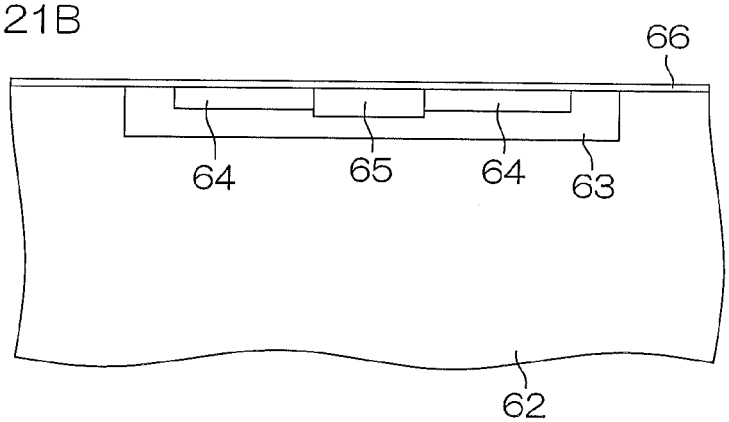
FIG. 21B is a schematic sectional view showing a step subsequent to FIG. 21A.

Then, the gate insulating film 66 is formed on the surface of the SiC epitaxial layer 62 by thermal oxidation, as shown in FIG. 21B.

Figure 21C:
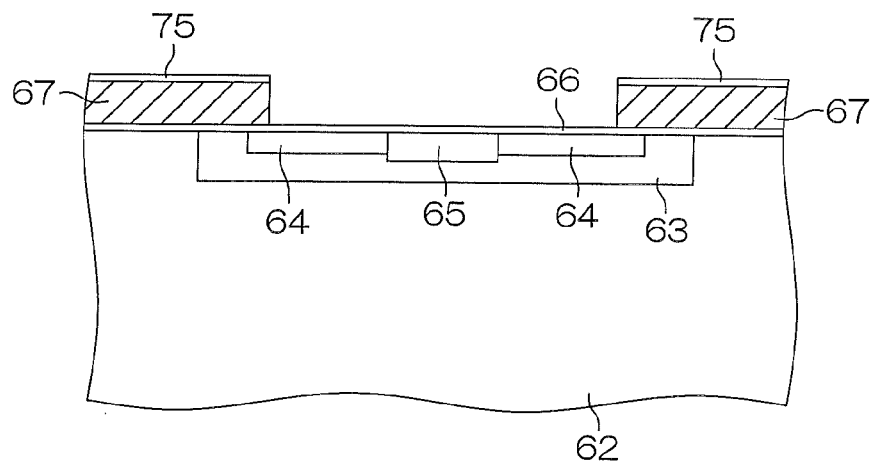
FIG. 21C is a schematic sectional view showing a step subsequent to FIG. 21B.

Thereafter polysilicon is deposited on the gate insulating film 66 by CVD (Chemical Vapor Deposition), as shown in FIG. 21C. Then, the deposition layer of the polysilicon is doped with B (boron) by ion implantation, in order to convert the deposition layer of the polysilicon to a deposition layer of doped polysilicon. Then, the deposition layer of the doped polysilicon is selectively removed by photolithography and etching, and the gate electrode 67 made of the doped polysilicon is formed on the gate insulating film 66. In the process up to patterning of the gate electrode 67, a native oxide 75 made of $SiO_2$ is formed on the surface of the gate electrode 67.

Figure 21D:
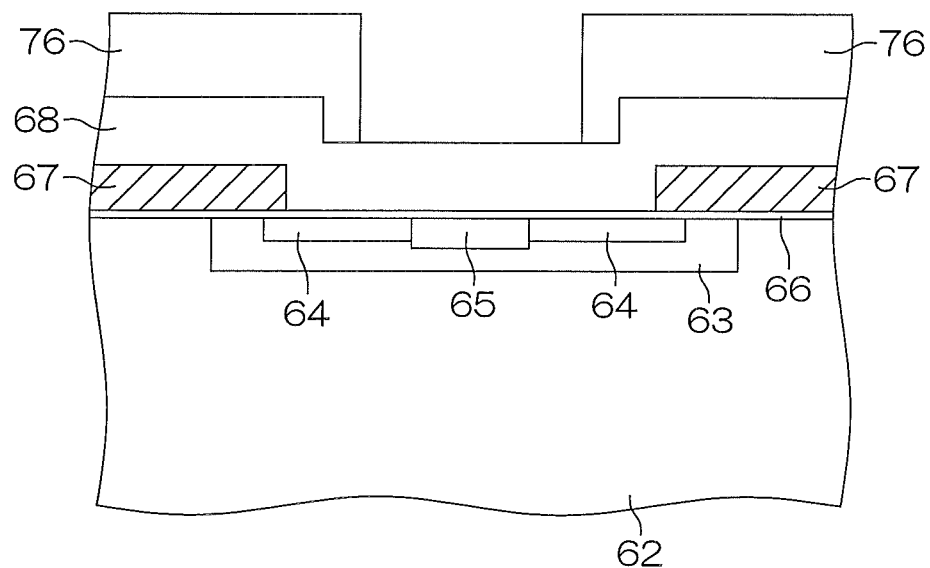
FIG. 21D is a schematic sectional view showing a step subsequent to FIG. 21C.

Then, the interlayer dielectric film 68 is formed on the SiC epitaxial layer 62 by CVD, as shown in FIG. 21D. The native oxide 75 on the surface of the gate electrode 67 integrates with the interlayer dielectric film 68. Thereafter a resist pattern 76 is formed on the interlayer dielectric film 68 by photolithography. The resist pattern 76 has an opening opposed to a portion of the interlayer dielectric film 68 for forming the contact hole 69.

Figure 21E:
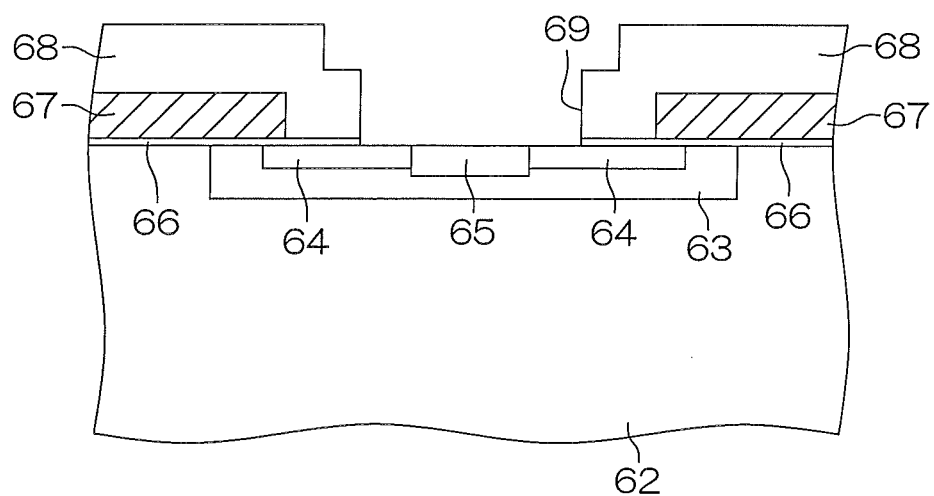
FIG. 21E is a schematic sectional view showing a step subsequent to FIG. 21D.

Thereafter the contact hole 69 is formed in the interlayer dielectric film 68 by etching employing the resist pattern 76 as a mask, as shown in FIG. 21E.

Figure 21F:
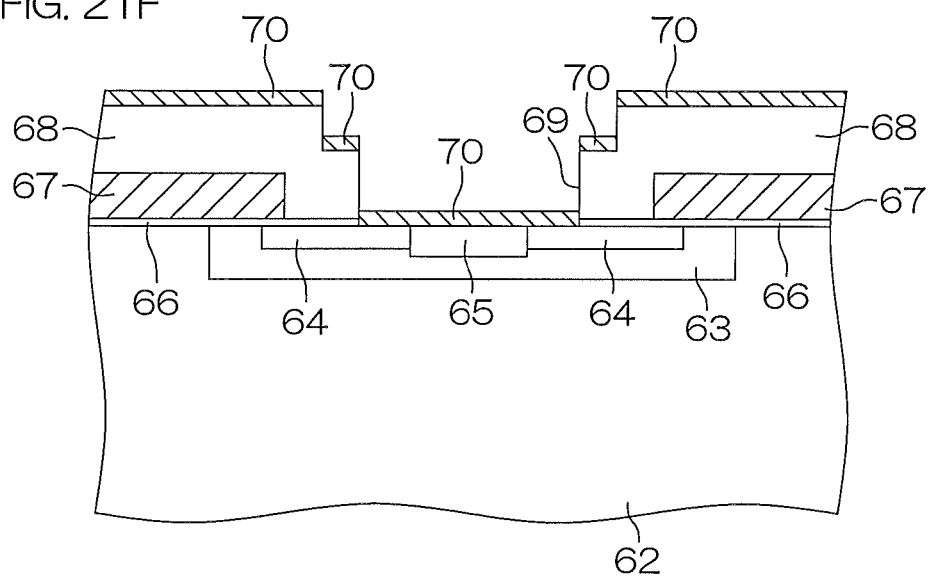
FIG. 21F is a schematic sectional view showing a step subsequent to FIG. 21E.

Then, Ti and TiN are successively vapor-deposited on portions of the surfaces of the source region 64 and the body contact region 65 facing the inner portion of the contact hole 69 (on the bottom surface of the contact hole 69) and on the surface of the interlayer dielectric film 68 by sputtering, whereby the ohmic metal 70 is formed, as shown in FIG. 21F.

Figure 21G:
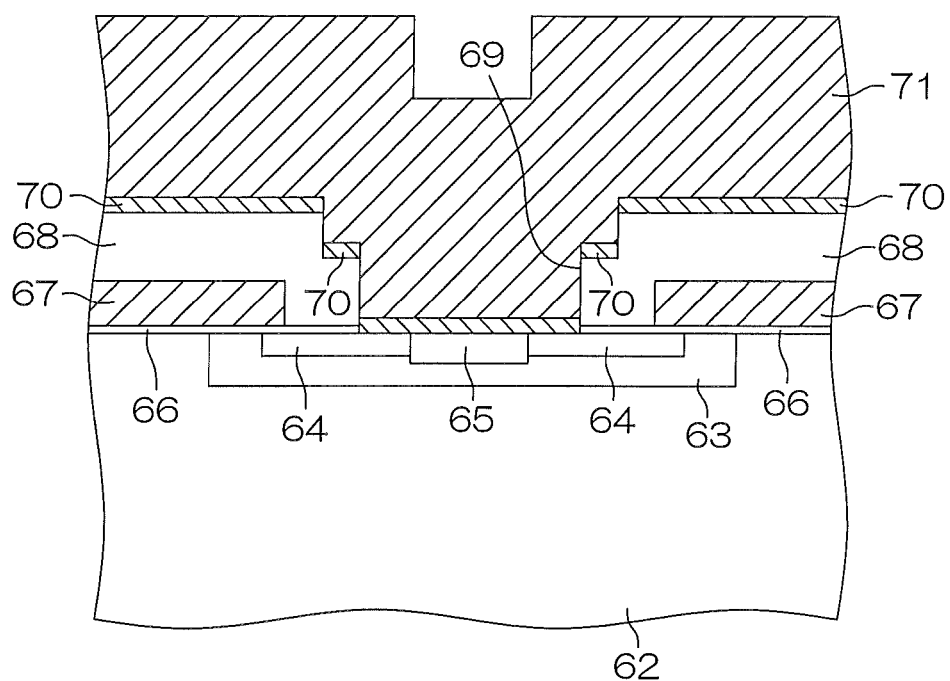
FIG. 21G is a schematic sectional view showing a step subsequent to FIG. 21F.

Following the vapor deposition of Ti and TiN, the source electrode 71 is formed on the ohmic metal 70 by sputtering, as shown in FIG. 21G. Thereafter photosensitive polyimide is applied onto the source electrode 71. Then, the photosensitive polyimide is selectively removed in order to expose part of the source electrode 71 as a pad, and curing of the photosensitive polyimide is thereafter performed. Thus, the photosensitive polyimide forms the polyimide layer 72, and the semiconductor device 61 shown in FIG. 20 is obtained.

As hereinabove described, the semiconductor device 61 includes the SiC epitaxial layer 62, the source region 64 selectively formed on the surface layer portion of the SiC epitaxial layer 62, the body contact region 65 selectively formed on the surface layer portion of the SiC epitaxial layer 62 adjacently to the source region 64, and the ohmic metal 70 formed over the source region 64 and the body contact region 65. Al which is the P-type impurity is contained in the surface layer portion of the body contact region 65 in excess of the solution limit with respect to SiC.

The P-type impurity is contained in the surface layer portion of the body contact region 65 in a concentration exceeding the solution limit with respect to SiC, whereby low-resistance ohmic contact can be attained not only with respect to the N-type source region 64, but also with respect to the P-type body contact region 65, without performing a heat treatment after formation of the ohmic metal 70.

The semiconductor device 61 first requires no heat treatment for obtaining low-resistance ohmic contact, whereby the cost and the time required for manufacturing can be reduced as compared with the conventional SiC semiconductor device.

According to the embodiment, Al is contained in the portion of the body contact region 65 having the depth of 500 Å to 1000 Å from the surface in excess of the solution limit with respect to SiC, and Al is contained in the portion of the body contact region 65 having the depth of not less than 1000 Å from the surface in the quantity less than the solution limit with respect to SiC. Even if Al is excessively contained in the portion of the body contact region 65 having the depth of not less than 1000 Å from the surface, the excess Al does not contribute to reduction of the contact resistance. Therefore, futileness caused by doping such a deep portion with Al in a high concentration can be avoided, and the cost and the time required for manufacturing SiC can be further reduced.

The body contact region 65 is formed by the multistage ion implantation. According to the multistage ion implantation, the P-type impurity can be easily implanted into the portion of the body contact region 65 having the depth of 50 nm to 100 nm from the surface in excess of the solution limit with respect to SiC.

The N-type impurity concentration in the surface layer portion of the source region 64 is controlled in the range of $1 \times 10^{20}$ cm$^{-3}$ to $5 \times 10^{20}$ cm$^{-3}$, whereby low-resistance ohmic contact with respect to the N-type source region 64 can be reliably obtained.

While the embodiments of the present invention have been described, the present invention may be embodied in other modes.

For example, while the structure provided with the plurality of trenches 18 has been employed in each of the first and second embodiments, one trench 18 may be formed between source regions 14 adjacent to each other. However, the plurality of trenches 18 are so formed that the channel width can be further enlarged.

The P-type impurity for the formation of the body region (13, 43, 63) and the body contact region (15, 45, 65) is not restricted to Al, but may be other group III atoms (B or the like).

The N-type impurity for the formation of the source region (14, 44, 64) is not restricted to P, but may be other group V atoms (As (arsenic) or the like).

Further, the ohmic metal (21, 50, 70) is not restricted to that having the multilayer structure of Ti/TiN. For example, the ohmic metal may have a single-layer structure made of one type of material selected from a group of Ti, TiN, Ni, Al, Ta (tantalum), TaN (tantalum nitride), W (tungsten) and WN (tungsten nitride), or may have a multilayer structure obtained by stacking layers made of a plurality of materials selected from the group.

In the semiconductor device (1, 31, 41, 61), a structure obtained by inverting the conductivity types (the P type and the N type) of the respective semiconductor portions may be employed.

The substrate for the semiconductor device (1, 31, 41, 61) is not restricted to the SiC substrate, but may be an Si (silicon) substrate. In this case, an SiC epitaxial layer as a semiconductor layer is stacked on the Si substrate.

The gate insulating film (16, 46, 66) may be made of an insulating material other than $SiO_2$. In other words, the present invention is not restricted to the VDMOSFET, but can be applied to a semiconductor device including a VDMISFET employing an insulating material other than $SiO_2$ as the material for a gate insulating film.

Further, the present invention can also be applied to a semiconductor device including an IGBT (Insulated Gate Bipolar Transistor) or an SJMOSFET (Super Junction Metal Oxide Semiconductor Field Effect Transistor).

EXAMPLES

While the present invention is now described with reference to Examples and comparative examples, the present invention is not restricted to the following Examples.

Examples 1 to 12 and Comparative Example 1

In order to prove effects of reduction of on-resistance and a drain leakage current, Examples 1 to 12 and comparative example 1 were executed as follows:

Example 1

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 300 keV and a dose of $7 \times 10^{13}$ cm$^{-2}$.

Figure 22:
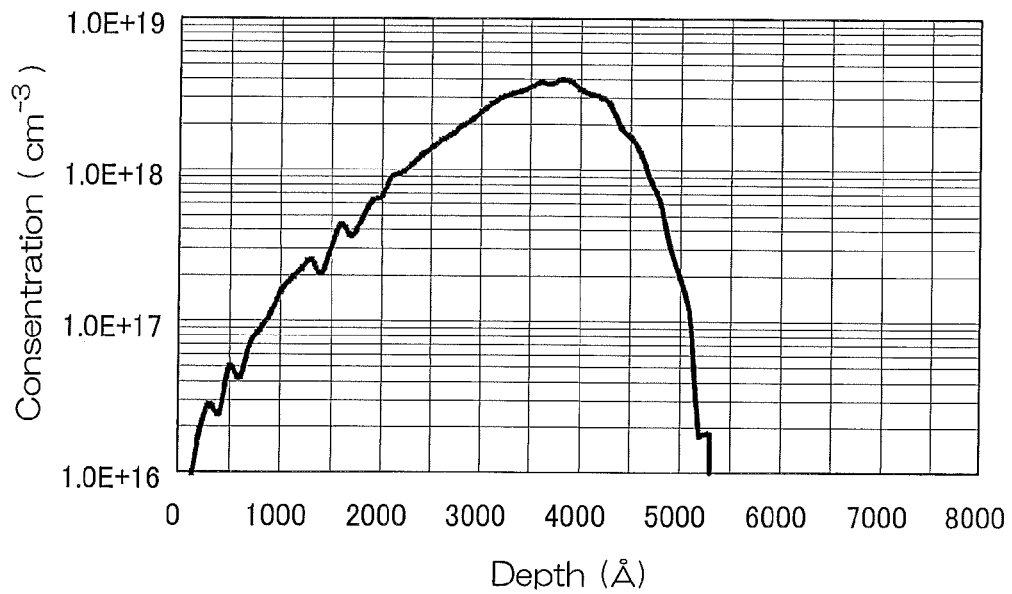
FIG. 22 is a graph showing an impurity concentration profile in a P-type region according to Example 1.

Thus, the P-type region having an impurity concentration profile shown in FIG. 22 was obtained. In other words, the P-type region has such an impurity concentration profile that the P-type impurity concentration in a portion of not more than 800 Å (80 nm) from the surface of the SiC epitaxial layer 42 is not more than $1 \times 10^{18}$ cm$^{-3}$.

Example 2

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 300 keV and a dose of $6 \times 10^{13}$ cm$^{-2}$.

Figure 23:
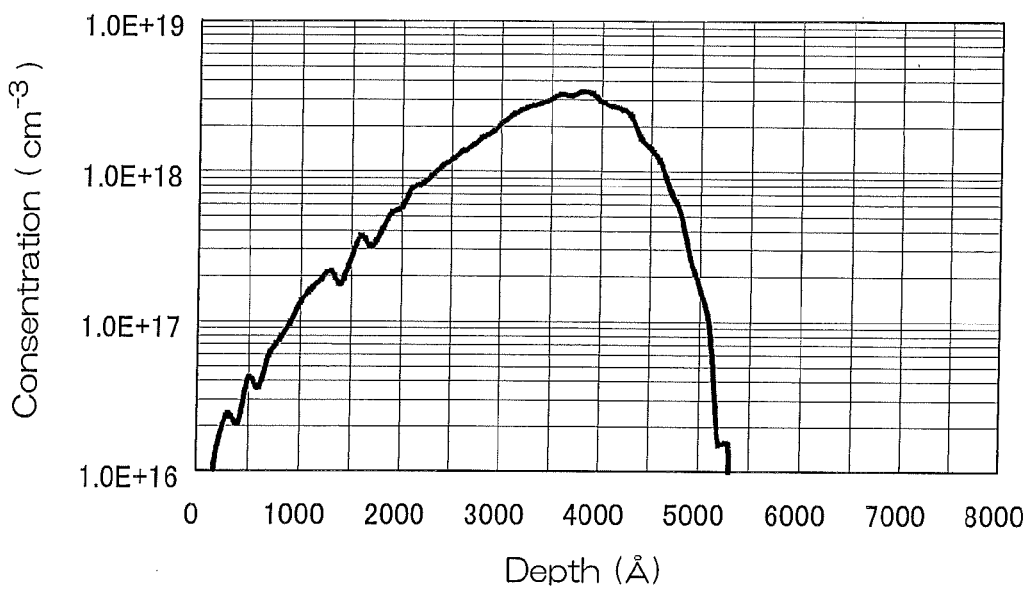
FIG. 23 is a graph showing an impurity concentration profile in a P-type region according to Example 2.

Thus, the p-type region having an impurity concentration profile shown in FIG. 23 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 3

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 300 keV and a dose of $5 \times 10^{13}$ cm$^{-2}$.

Figure 24:
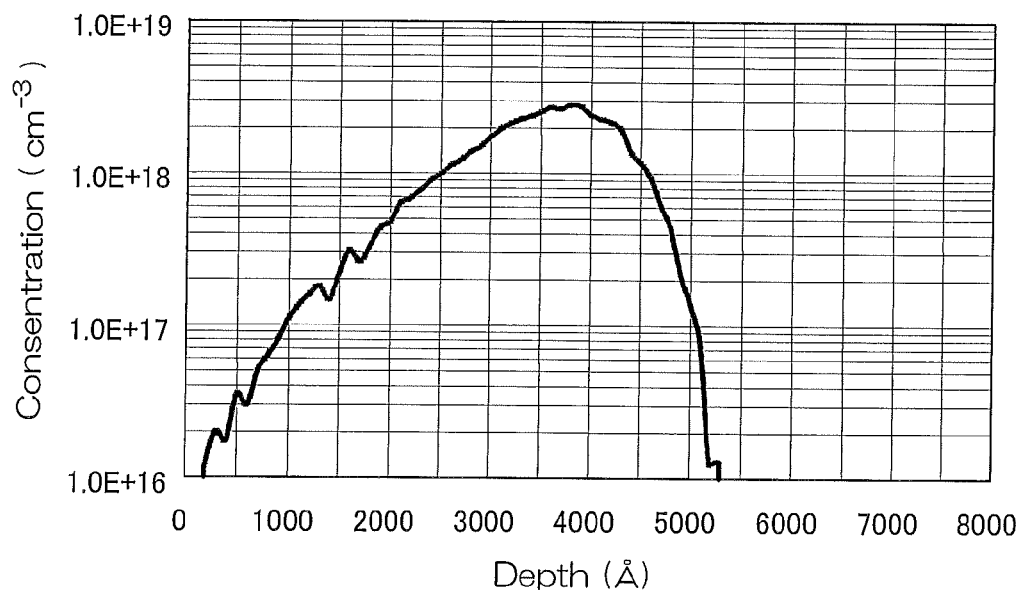
FIG. 24 is a graph showing an impurity concentration profile in a P-type region according to Example 3.

Thus, the p-type region having an impurity concentration profile shown in FIG. 24 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 4

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 300 keV and a dose of $4 \times 10^{13}$ cm$^{-2}$.

Figure 25:
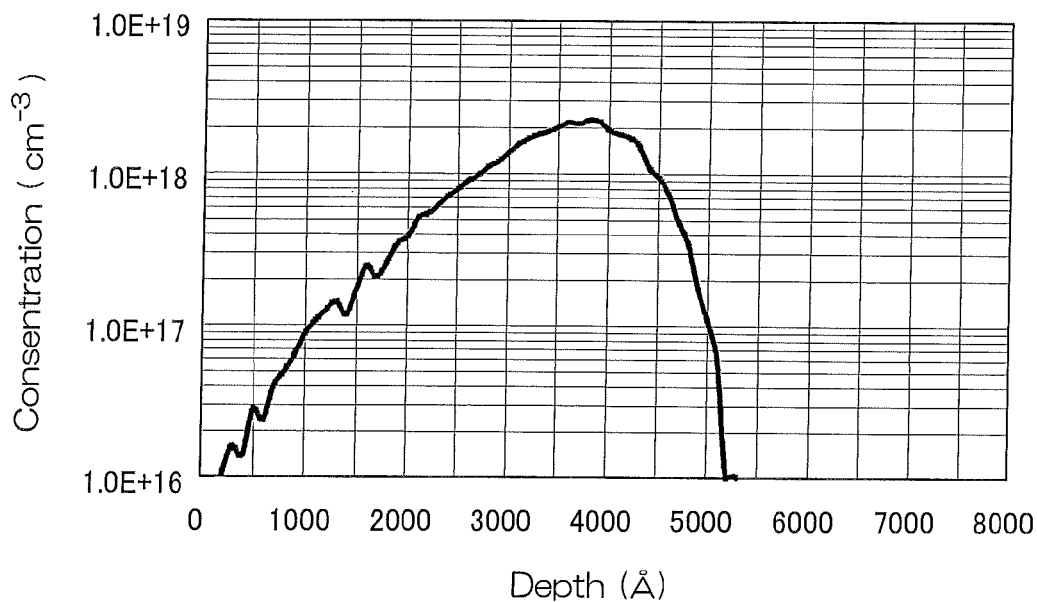
FIG. 25 is a graph showing an impurity concentration profile in a P-type region according to Example 4.

Thus, the p-type region having an impurity concentration profile shown in FIG. 25 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 5

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 340 keV and a dose of $7 \times 10^{13}$ cm$^{-2}$.

Figure 26:
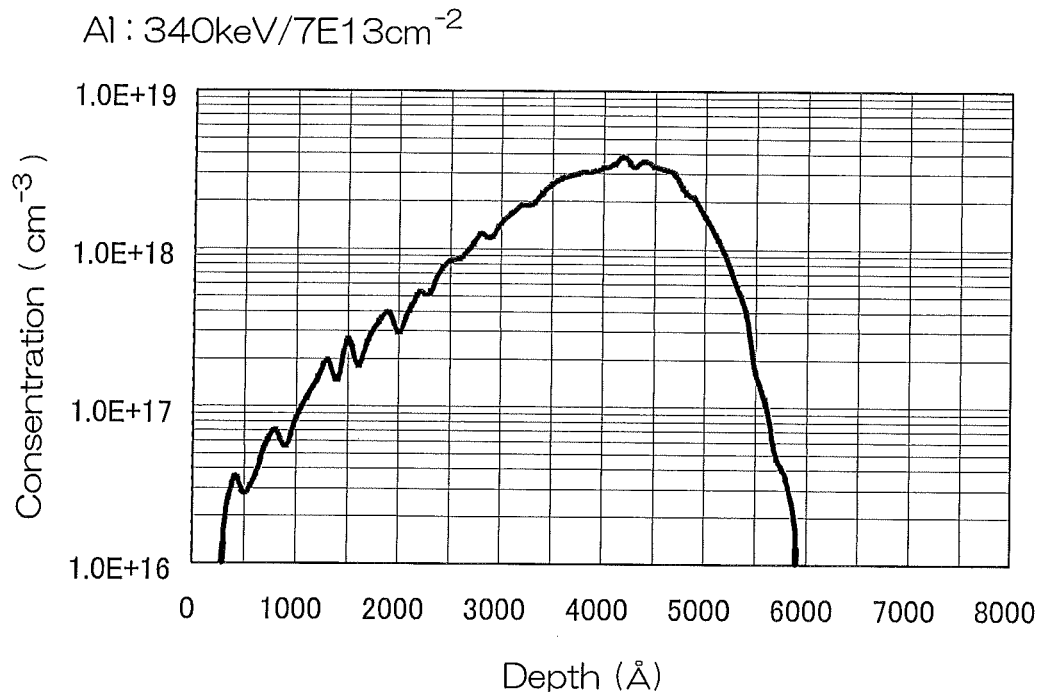
FIG. 26 is a graph showing an impurity concentration profile in a P-type region according to Example 5.

Thus, the p-type region having an impurity concentration profile shown in FIG. 26 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 6

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 340 keV and a dose of $6 \times 10^{13}$ cm$^{-2}$.

Figure 27:
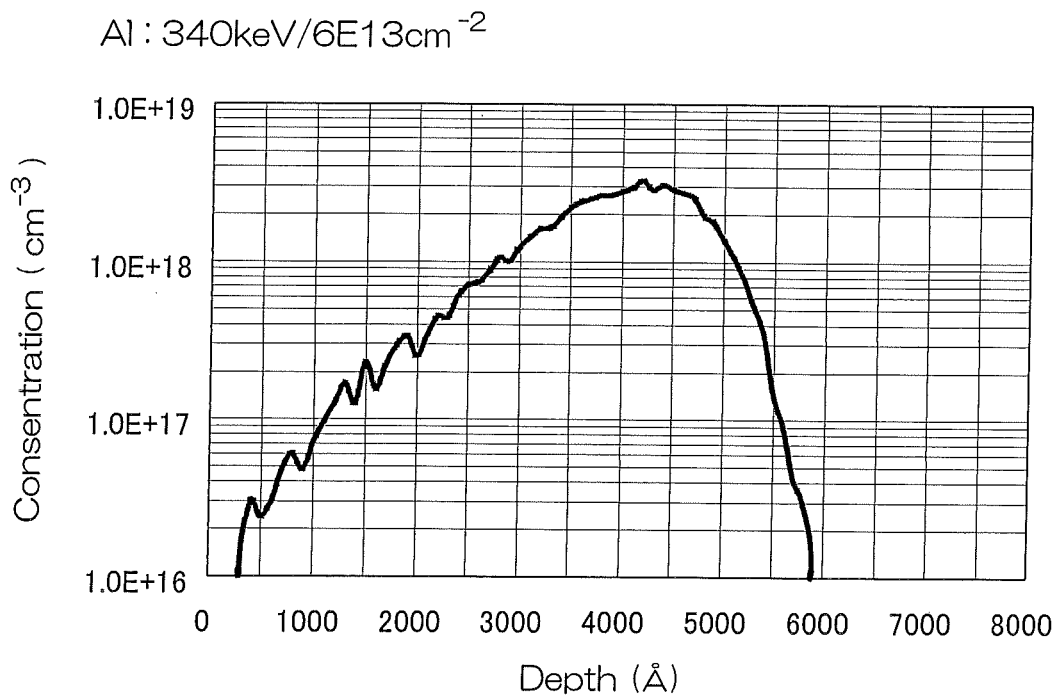
FIG. 27 is a graph showing an impurity concentration profile in a P-type region according to Example 6.

Thus, the p-type region having an impurity concentration profile shown in FIG. 27 was obtained. In other words, the P-type region has such an impurity concentration profile that the P-type impurity concentration in a portion of not more than 800 Å from the surface of the SiC epitaxial layer 42 is not more than $1 \times 10^{13}$ cm$^{-3}$.

Example 7

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 340 keV and a dose of $5 \times 10^{13}$ cm$^{-2}$.

Figure 28:
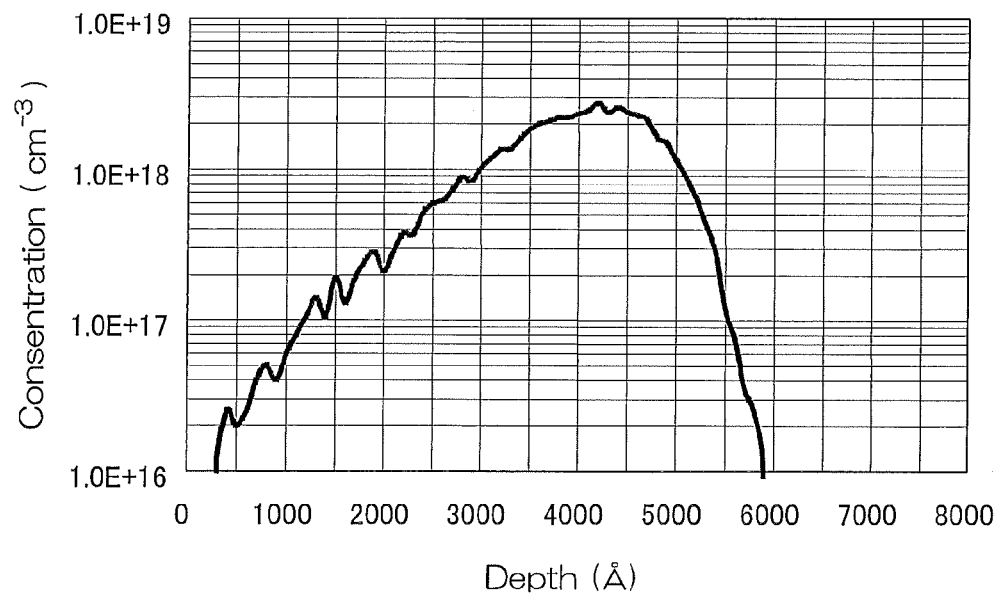
FIG. 28 is a graph showing an impurity concentration profile in a P-type region according to Example 7.

Thus, the p-type region having an impurity concentration profile shown in FIG. 28 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 8

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 340 keV and a dose of $4 \times 10^{13}$ cm$^{-2}$.

Figure 29:
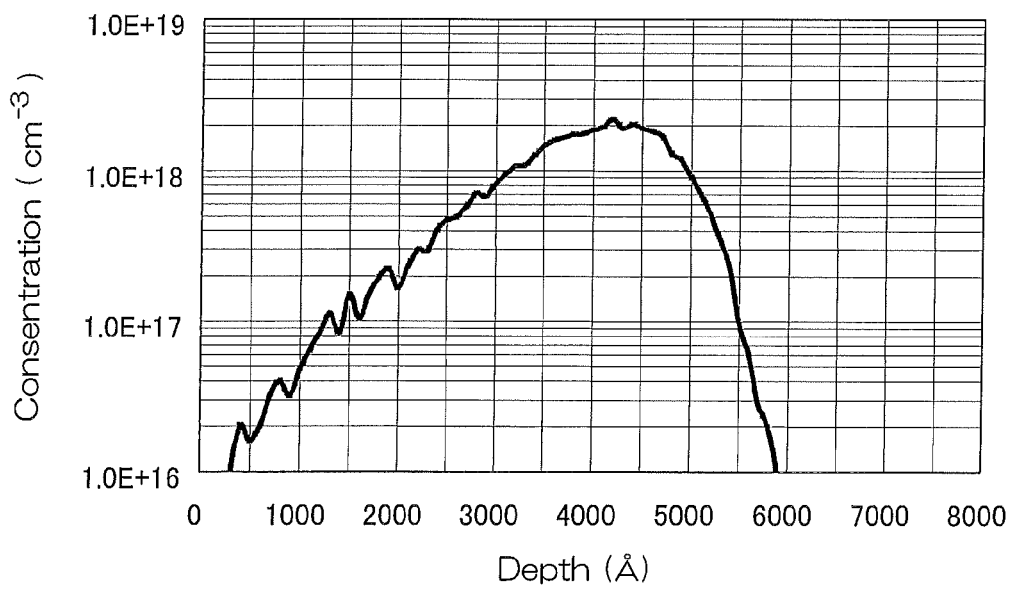
FIG. 29 is a graph showing an impurity concentration profile in a P-type region according to Example 8.

Thus, the p-type region having an impurity concentration profile shown in FIG. 29 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 9

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 380 keV and a dose of $7 \times 10^{13}$ cm$^{-2}$.

Figure 30:
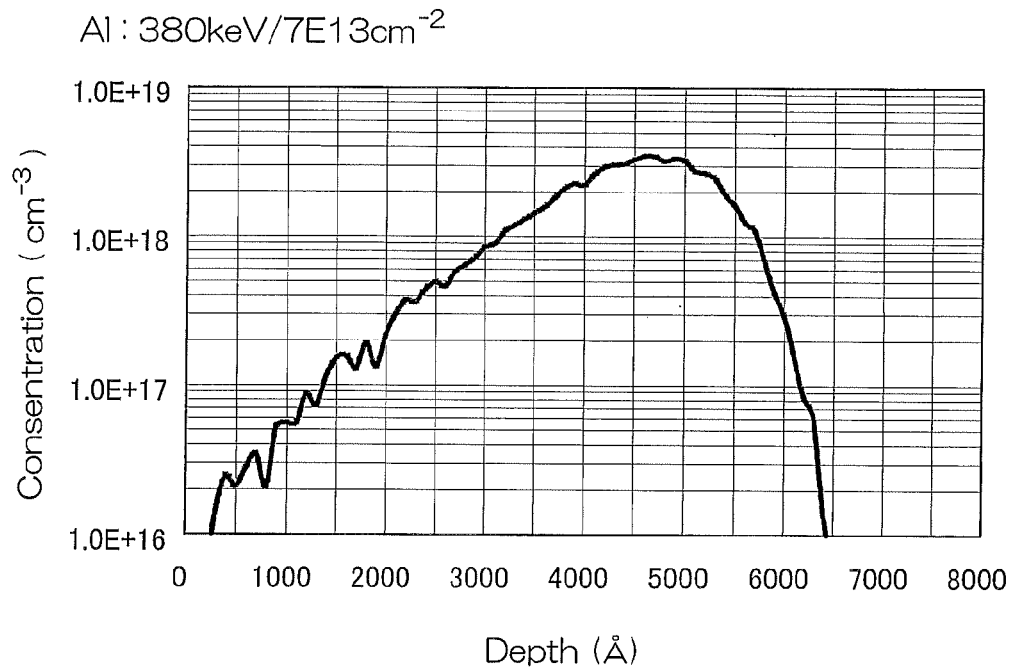
FIG. 30 is a graph showing an impurity concentration profile in a P-type region according to Example 9.

Thus, the p-type region having an impurity concentration profile shown in FIG. 30 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 10

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 380 keV and a dose of $6 \times 10^{13}$ cm$^{-2}$.

Figure 31:
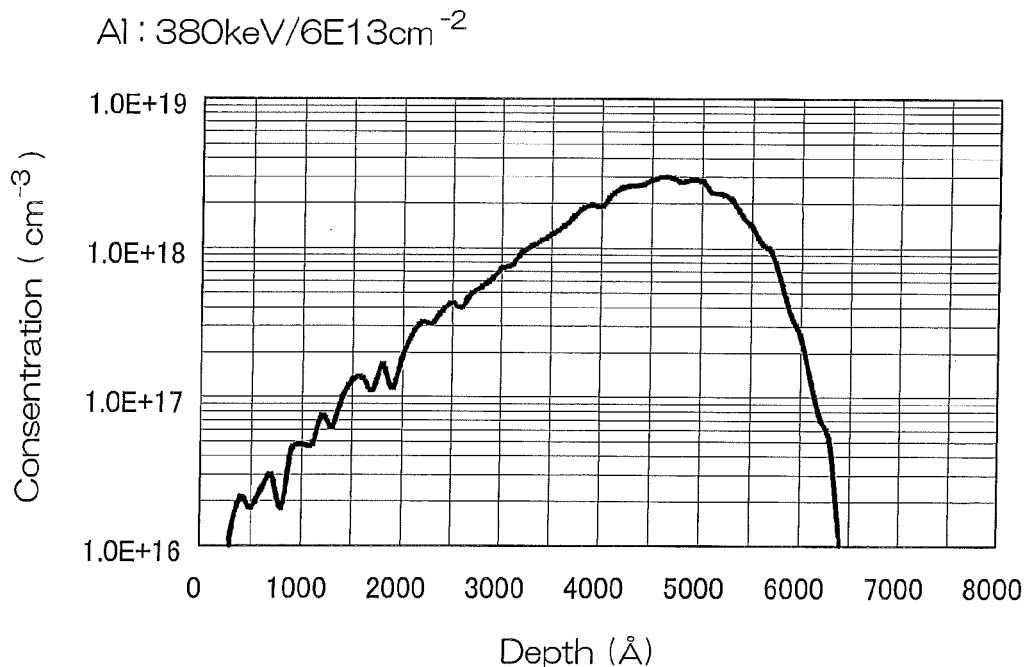
FIG. 31 is a graph showing an impurity concentration profile in a P-type region according to Example 10.

Thus, the p-type region having an impurity concentration profile shown in FIG. 31 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 11

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 380 keV and a dose of $5 \times 10^{13}$ cm$^{-2}$.

Figure 32:
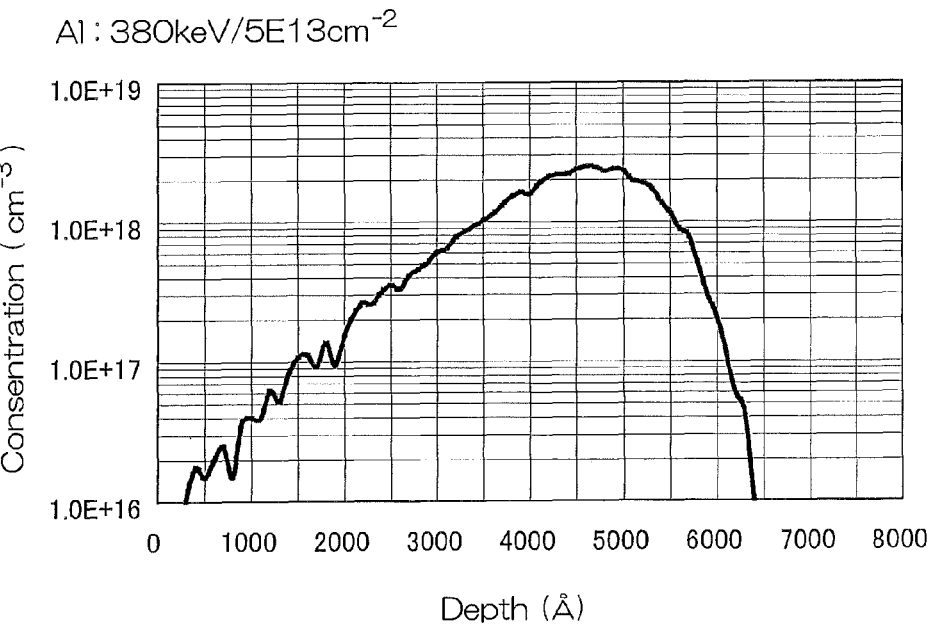
FIG. 32 is a graph showing an impurity concentration profile in a P-type region according to Example 11.

Thus, the p-type region having an impurity concentration profile shown in FIG. 32 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

Example 12

An SiC epitaxial layer having an N-type impurity concentration of $7 \times 10^{15}$ cm$^{-3}$ was formed on an SiC substrate by epitaxy. Then, a P-type region (a body region) was formed by doping a surface layer portion of the SiC epitaxial layer with Al by single-stage ion implantation with implantation energy of 380 keV and a dose of $4 \times 10^{13}$ cm$^{-2}$.

Figure 33:
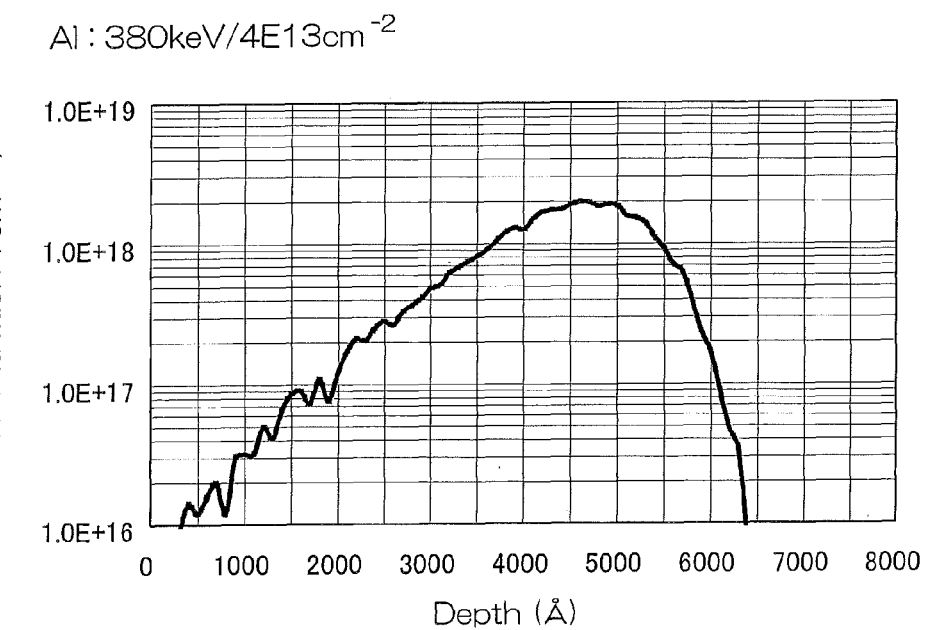
FIG. 33 is a graph showing an impurity concentration profile in a P-type region according to Example 12.

Thus, the p-type region having an impurity concentration profile shown in FIG. 33 was obtained. In other words, the P-type region has such an impurity concentration profile that the P-type impurity concentration in a portion of not more than 800 Å from the surface of the SiC epitaxial layer 42 is not more than $1 \times 10^{18}$ cm$^{-3}$.

[On-Resistance]

An SiC semiconductor device having the structure (the structure shown in FIG. 15) according to the embodiment of the present invention was produced by using the structure according to each of Examples 1 to 12, to examine on-resistance of a MOSFET in each SiC semiconductor device. The results are shown in FIG. 34 in a table form, and shown in FIG. 35 in a graph.

From the results, it is understood that the on-resistance of each MOSFET is lower than 0.5Ω.

[Threshold Voltage]

An SiC semiconductor device having the structure (the structure shown in FIG. 16) according to the embodiment of the present invention was produced by using the structure according to each of Examples 1 to 12. Then, a gate voltage (a threshold voltage) of a MOSFET in a case where a source electrode was grounded, a drain voltage of 10 V was applied to a drain electrode and a drain current Id of 1 mA flowed was examined in each SiC semiconductor device. The results are shown in FIG. 34 in a table form, ad shown in FIG. 36 in a graph.

From the results, it is understood that the threshold voltage of each MOSFET is higher than 2.5 V.

[Drain Leakage Current]

Figure 37:
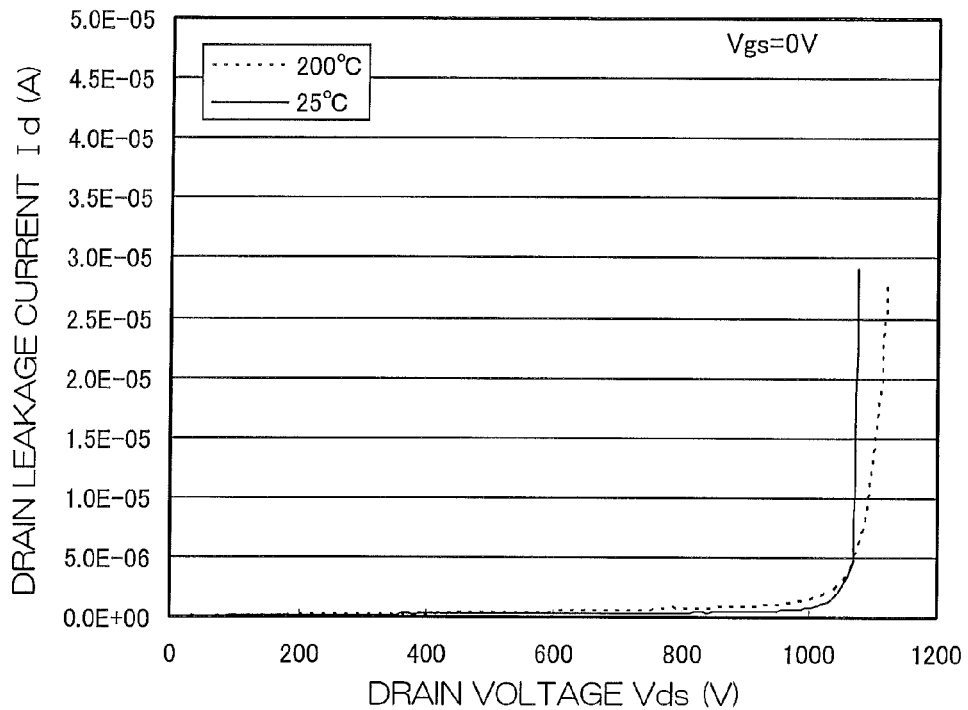
FIG. 37 is a graph showing a measurement result of a drain leakage current in the SiC semiconductor device using the structure according to Example 10.

An SiC semiconductor device having the structure (the structure shown in FIG. 16) according to the embodiment of the present invention was produced by using the structure according to Example 10. Then, a drain leakage current Id was measured by varying a drain voltage (a drain-to-source voltage) Vds while fixing a gate voltage (a gate-to-source voltage) Vgs to zero in states where the temperature of the SiC semiconductor device was 25° C. and 200° C. The results are shown in FIG. 37 in a graph.

From the results, it is understood that the drain leakage current Id is small in the range where the drain voltage Vds is not more than 1000 V in both of the cases where the temperature of the SiC semiconductor device is 25° C. and 200° C.

Comparative Example 1

Figure 38:
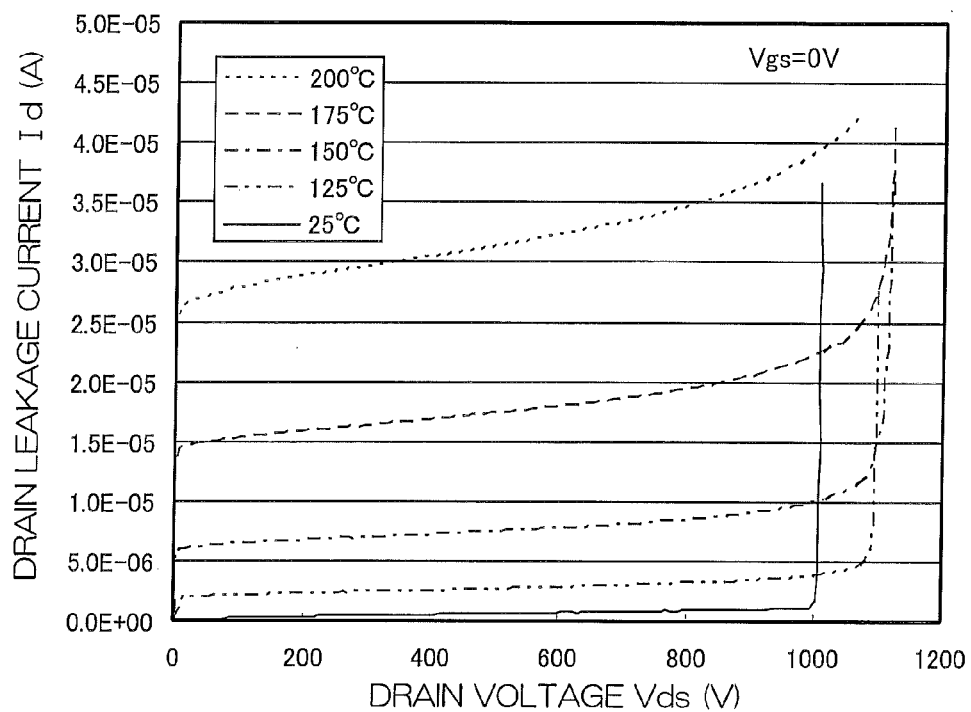
FIG. 38 is a graph showing a measurement result of a drain leakage current in an SiC semiconductor device according to comparative example 1.

An SiC semiconductor device of a structure similar to the structure (the structure shown in FIG. 16) according to the embodiment of the present invention having a gate electrode made of N-type polysilicon (N-type polysilicon containing P (phosphorus) as an N-type impurity in a concentration of not less than $1 \times 10^{20}$ cm$^{-3}$) was produced by using the structure according to Example 10. Then, a drain leakage current Id was measured by varying a drain voltage (a drain-to-source voltage) Vds while fixing a gate voltage (a gate-to-source voltage) Vgs to zero in states where the temperature of the SiC semiconductor device was 25° C., 125° C., 150° C., 175° C. and 200° C. The results are shown in FIG. 38.

From the results, it is understood that a relatively large drain leakage current Id flows when the temperature of the SiC semiconductor device is 125° C. to 200° C., even if the drain voltage Vds is small. It is also understood that a relatively large drain leakage current Id flows when the drain voltage Vds exceeds 400 V, also when the temperature of the SiC semiconductor device is 25° C. Further, it is understood by comparing the results shown in FIG. 37 and the results shown in FIG. 38 with one another that the drain leakage current Id is remarkably reduced in the SiC semiconductor device using the structure according to Example 10, as compared with the SiC semiconductor device according to comparative example 1.

Example 13 and Comparative Examples 2 and 3

In order to prove reduction of contact resistance of an ohmic metal with respect to a body contact region, Examples 1 to 12 and comparative example 1 were executed as follows:

Example 13

Figure 39:
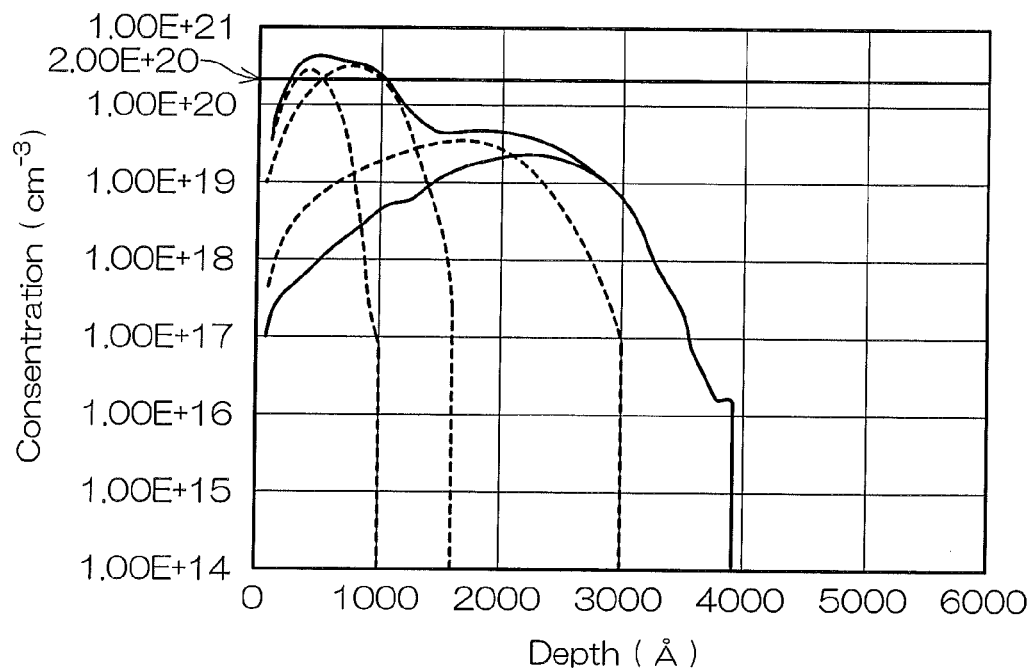
FIG. 39 is a graph showing an impurity concentration profile in a P$^+$ region according to Example 13.

An SiC epitaxial layer containing no impurity was formed on an SiC substrate by epitaxy. Then, a $P^+$ region (a body contact region) was formed by doping a surface layer portion of the SiC epitaxial layer with Al by four-stage ion implantation. Implantation energy, a dose and the maximum value (a peak concentration) of the Al concentration in each stage are as follows:
 First Stage
 Implantation energy: 180 keV
 Dose: $3\times10^{14}$ cm$^{-2}$
 Peak Concentration: $2.26\times10^{19}$ cm$^{-3}$
 Second Stage
 Implantation energy: 120 keV
 Dose: $4\times10^{14}$ cm$^{-2}$
 Peak Concentration: $3.15\times10^{19}$ cm$^{-3}$
 Third Stage
 Implantation energy: 60 keV
 Dose: $2\times10^{15}$ cm$^{-2}$
 Peak Concentration: $3.08\times10^{20}$ cm$^{-3}$
 Fourth Stage
 Implantation energy: 30 keV
 Dose: $1\times10^{15}$ cm$^{-2}$
 Peak Concentration: $2.69\times10^{20}$ cm$^{-3}$ Thus, the $P^+$ region having an impurity concentration profile shown in FIG. 39 was obtained. In other words, the $P^+$ region according to Example 13 has such a box-type impurity concentration profile that the P-type impurity concentration in a portion having a depth of 500 Å to 1000 Å from the surface thereof is $2\times10^{20}$ cm$^{-3}$ to $5\times10^{20}$ cm$^{-3}$ and the Al concentration in a portion having a depth of not less than 1000 Å from the surface is not more than $2\times10^{20}$ cm$^{-3}$.

Then, an ohmic metal having a multilayer structure of Ti/TiN was formed on the surface of the $P^+$ region by sputtering. The thickness of the Ti layer is 250 Å, and the thickness of the TiN layer is 1300 Å.

Comparative Example 2

Figure 40:
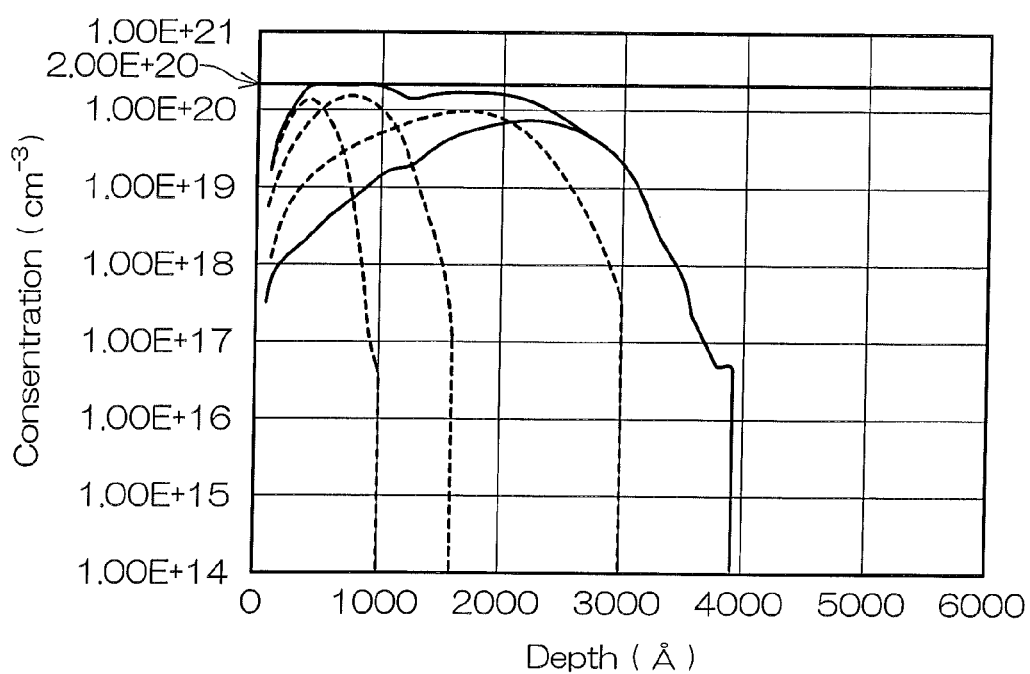
FIG. 40 is a graph showing impurity concentration profiles in P$^+$ regions according to comparative examples 2 and 3.

An SiC epitaxial layer containing no impurity was formed on an SiC substrate by epitaxy, similarly to the case of Example 13. Then, a $P^+$ region (a body contact region) was formed by doping a surface layer portion of the SiC epitaxial layer with Al by four-stage ion implantation. Implantation energy, a dose and the maximum value (a peak concentration) of the Al concentration in each stage are as follows:
 First Stage
 Implantation energy: 180 keV
 Dose: $1\times10^{15}$ cm$^{-2}$
 Peak Concentration: $7.54\times10^{19}$ cm$^{-3}$
 Second Stage
 Implantation energy: 120 keV
 Dose: $1.3\times10^{15}$ cm$^{-2}$
 Peak Concentration: $1.02\times10^{20}$ cm$^{-3}$
 Third Stage
 Implantation energy: 60 keV
 Dose: $9\times10^{14}$ cm$^{-2}$
 Peak Concentration: $1.39\times10^{20}$ cm$^{-3}$
 Fourth Stage
 Implantation energy: 30 keV
 Dose: $4\times10^{15}$ cm$^{-2}$
 Peak Concentration: $1.07\times10^{20}$ cm$^{-3}$ Thus, the $P^+$ region having an impurity concentration profile shown in FIG. 40 was obtained. In other words, the PV region according to comparative example 2 has such a box-type impurity concentration profile that the Al concentration is not more than $2\times10^{20}$ cm$^{-3}$ in the whole area in the depth direction thereof.

Then, an ohmic metal having a multilayer structure of Ti/TiN was formed on the surface of the $P^+$ region by sputtering. The thickness of the Ti layer is 250 Å, and the thickness of the TiN layer is 1300 Å.

Comparative Example 3

A $P^+$ region was formed on a surface layer portion of an SiC epitaxial layer under conditions similar to those in the case of comparative example 2. Then, an ohmic metal having a multilayer structure of Ti/TiN was formed on the surface of the $P^+$ region by sputtering. The thickness of the Ti layer is 250 Å, and the thickness of the TiN layer is 1300 Å. Thereafter a heat treatment (PDA) was performed at a high temperature of about 1000° C.

[Contact Characteristics]

Contact characteristics of the $P^+$ region and the ohmic metal were examined according to TLM in the structure according to each of Example 13 and comparative example 3.

More specifically, four ohmic metals, i.e., first to fourth ohmic metals were formed on the $P^+$ region so that the interval between the first ohmic metal and the second ohmic metal was 10 μm, the interval between the second ohmic metal and the third ohmic metal was 20 μm and the interval between the third ohmic metal and the fourth ohmic metal was 30 μm in each structure. Then, electric resistance between the first ohmic metal and the second ohmic metal, electric resistance between the second ohmic metal and the third ohmic metal and electric resistance between the third ohmic metal and the fourth ohmic metal were measured, and contact resistance was calculated from the results of the measurement of the electric resistance.

The contact resistance in the structure according to Example 13 was $1\times10^{-4}$ Ω·cm$^2$ to $2\times10^{-4}$ Ω·cm$^2$. On the other hand, the contact resistance in the structure according to comparative example 3 was $5\times10^{-3}$ Ω·cm$^2$. As a result, it was confirmed that reduction of the contact resistance by not less than one figure is implemented in the structure according to Example 13, as compared with the structure according to comparative example 3.

[I-V Characteristics]

Figure 41:
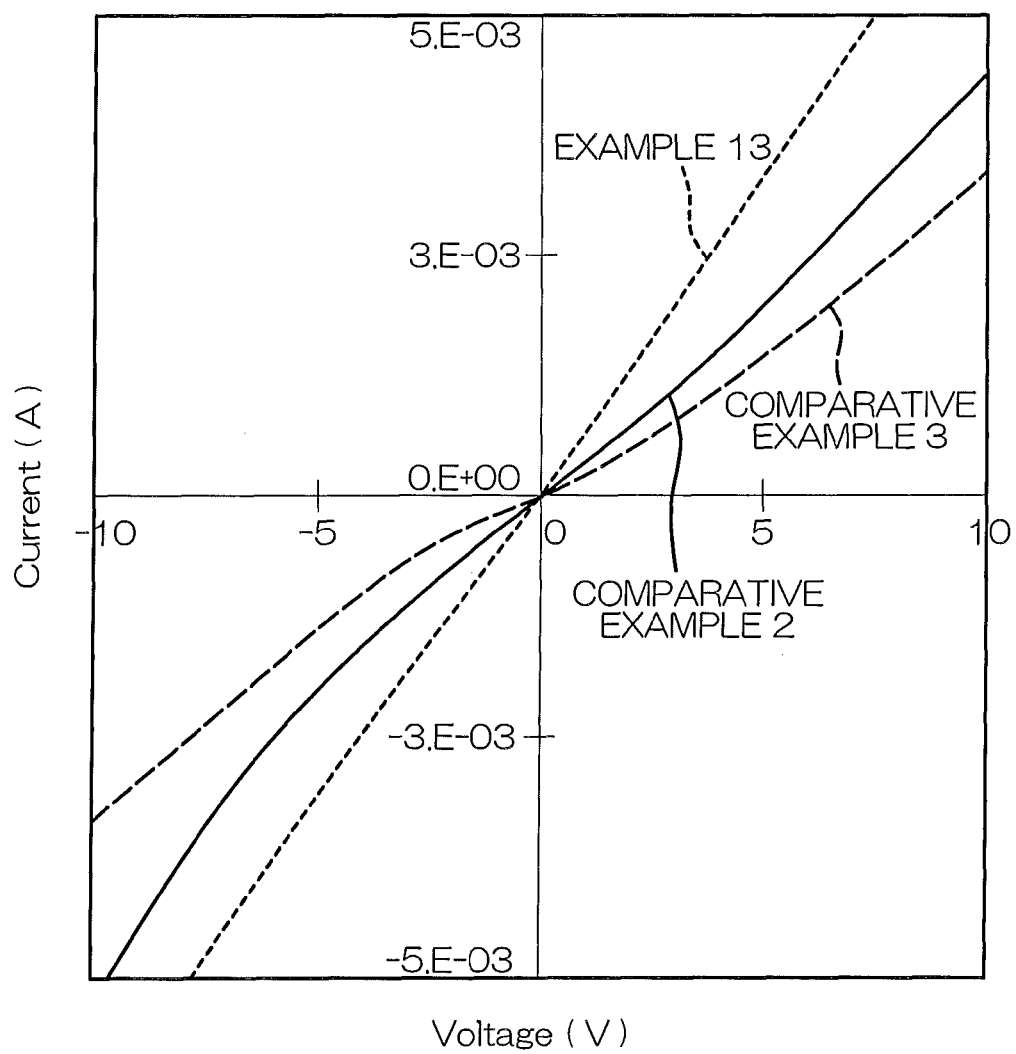
FIG. 41 is a graph showing I-V characteristics in structures according to Example 13 and comparative examples 2 and 3.

In the structure according to each of Example 13 and comparative examples 2 and 3, four ohmic metals, i.e., first to fourth ohmic metals were formed on the $P^+$ region so that the interval between the first ohmic metal and the second ohmic metal was 10 μm, the interval between the second ohmic metal and the third ohmic metal was 20 μm and the interval between the third ohmic metal and the fourth ohmic metal was 30 μm. Then, I-V characteristics of an electrode pair consisting of the first ohmic metal and the second ohmic metal were examined. The results are shown in FIG. 41. From the results, it was confirmed that the I-V characteristics exhibited linearity and ohmic characteristics were superior in the structure according to Example 13 to the structures according to comparative examples 2 and 3.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The components shown in each embodiment of the present invention can be combined within the range of the present invention.

This application corresponds to Japanese Patent Application No. 2009-074558 filed with the Japan Patent Office on Mar. 25, 2009, Japanese Patent Application No. 2009-101321 filed with the Japan Patent Office on Apr. 17, 2009, and Japanese Patent Application No. 2009-134822 filed with the Japan Patent Office on Jun. 4, 2009, the disclosures of which are incorporated herein by reference.

DESCRIPTION OF THE REFERENCE NUMERALS

1 ... semiconductor device, 4 ... gate pad, 5 ... gate finger, 12 ... SiC epitaxial layer, 13 ... body region, 14 ... source region, 16 ... gate insulating film, 17 ... gate electrode, 18 ... trench, 19 ... surface-opposed portion, 20 ... embedded portion, 21 ... ohmic metal, 24 ... surface (of SiC epitaxial layer), 25 ... side surface (of trench), 31 ... semiconductor device, 41 ... semiconductor device, 42 ... SiC epitaxial layer, 43 ... body region, 44 ... source region, 46 ... gate insulating film, 47 ... gate electrode, 53 ... gate pad, 54 ... gate finger, 61 ... semiconductor device, 62 ... SiC epitaxial layer, 63 ... body region, 64 ... source region, 65 ... body contact region, 70 ... ohmic metal, C ... unit cell

The invention claimed is:

1. A semiconductor device comprising:
an N-type semiconductor layer made of SiC;
a P-type region selectively formed on a surface layer portion of the N-type semiconductor layer;
an N-type region formed on a surface layer portion of the P-type region at an interval from a peripheral edge of the P-type region;
a gate insulating film formed on the N-type semiconductor layer; and
a gate electrode formed on the gate insulating film and opposed to a portion between the peripheral edge of the P-type region and the N-type region, wherein
a P-type impurity concentration in a portion of the P-type region having a depth of not more than 100 nm with reference to a center of the gate insulating film in a thickness direction is not more than $1 \times 10^{18}$ cm$^{-3}$, and
the gate electrode is made of polysilicon doped with a P-type impurity.

2. The semiconductor device according to claim 1, wherein the gate electrode is made of polysilicon doped with B (boron) with a dose of not less than $5 \times 10^{14}$ cm$^{-2}$ and not more than $5 \times 10^{15}$ cm$^{-2}$.

3. The semiconductor device according to claim 1, further comprising:
a gate pad formed on the N-type semiconductor layer for contributing to an electric connection with an outer portion; and
a gate finger formed on the N-type semiconductor layer, made of a metallic material, and electrically connected with the gate pad and the gate electrode.

4. The semiconductor device according to claim 3, wherein the gate pad is made of a same material as the gate finger.

5. A semiconductor device comprising:
a semiconductor layer made of SiC;
an N-type first impurity region selectively formed on a surface layer portion of the semiconductor layer;
a P-type second impurity region selectively formed on the surface layer portion of the semiconductor layer to be adjacent to the first impurity region and to be surrounded by the first impurity region; and
an ohmic metal formed over the first impurity region and the second impurity region, wherein
a P-type impurity is contained in a surface layer portion of the second impurity region in excess of a solubility limit with respect to SiC, and the P-type impurity is contained in excess of the solubility limit with respect to SiC in a portion of the second impurity region having a depth of 50 nm to 100 nm from a surface of the second impurity region that has the P-type impurity in excess of the solubility limit with respect to SiC.

6. The semiconductor device according to claim 5, wherein the P-type impurity is contained in a portion of the second impurity region having a depth of not less than 100 nm in a quantity less than the solubility limit with respect to SiC.

7. The semiconductor device according to claim 5, wherein the P-type impurity is contained in the surface layer portion of the second impurity region in a quantity greater than $2 \times 10^{20}$ cm$^{-3}$.

8. The semiconductor device according to claim 5, wherein the second impurity region has an impurity concentration profile formed by multistage ion implantation.

9. The semiconductor device according to claim 5, wherein the P-type impurity is Al.

10. The semiconductor device according to claim 5, wherein a concentration of an N-type impurity in a surface layer portion of the first impurity region is in a range of $1 \times 10^{20}$ cm$^{-3}$ to $5 \times 10^{20}$ cm$^{-3}$.

11. The semiconductor device according to claim 10, wherein the concentration of the N-type impurity in the surface layer portion of the first impurity region has a box-type impurity concentration profile.

12. The semiconductor device according to claim 5, wherein the ohmic metal has a single-layer structure made of one type of material selected from a group consisting of Ti, TiN, Ni, Al, Ta, TaN, W and WN, or a multilayer structure obtained by stacking layers made of a plurality of types of materials selected from a group consisting of Ti, TiN, Ni, Al, Ta, TaN, W and WN.

13. A semiconductor device comprising:
a semiconductor layer, of a first conductivity type, made of SiC;
a second conductivity type region selectively formed on a surface layer portion of the semiconductor layer;
a first impurity region, of the first conductivity type, formed on a surface layer portion of the second conductivity type region at an interval from a peripheral edge of the second conductivity type region;
a second impurity region, of a second conductivity type, formed on the surface layer portion of the second conductivity type region to be surrounded by the first impurity region;
a gate insulating film formed on the semiconductor layer;
a gate electrode formed on the gate insulating film and opposed to a portion of the second conductivity type region between the peripheral edge of the second conductivity type region and the first impurity region; and
an ohmic metal formed over the first impurity region and the second impurity region, wherein
an impurity concentration in a portion of the second conductivity type region having a depth of not more than 100 nm with reference to a center of the gate insulating film in a thickness direction is not more than $1\times10^{18}$ cm$^{-3}$, and a second conductivity type impurity is contained in a surface layer portion of the second impurity region in excess of a solubility limit with respect to SiC.

14. A semiconductor device comprising:

a semiconductor layer of a first conductivity type;

a plurality of first impurity regions of the first conductivity type selectively formed on a surface layer portion of the semiconductor layer;

a plurality of second impurity regions of a second conductivity type selectively formed on the surface layer portion of the semiconductor layer, the second impurity regions respectively surrounded by the first impurity regions;

a gate electrode facing an intervening region between respective ones of the first impurity regions that are next to each other;

a gate insulating film formed between the semiconductor layer and the gate electrode, the gate insulating film having an edge portion extending in a direction away from the gate electrode;

an ohmic metal formed over the first impurity regions and the second impurity regions through the edge portion of the gate insulating film; and an electrode electrically connected to the ohmic metal.

15. The semiconductor device according to claim 14, wherein the semiconductor layer is made of SiC.

16. The semiconductor device according to claim 14, wherein the intervening region includes third impurity regions of the second conductivity type, the third impurity regions surrounding respective ones of the first impurity regions.

17. The semiconductor device according to claim 16, wherein the third impurity regions extend under the first impurity regions, and the second impurity regions reach the third impurity regions through the first impurity regions.

18. The semiconductor device according to claim 14, further comprising an interlayer dielectric film formed over the gate electrode and the edge portion of the gate insulating film, and the ohmic metal is electrically connected to the first impurity regions and the second impurity regions through the interlayer dielectric film.

19. The semiconductor device according to claim 18, wherein a difference in level is formed between parts of the interlayer dielectric film above the edge portion of the gate insulating film.

20. The semiconductor device according to claim 18, wherein the ohmic metal is further formed over the interlayer dielectric film.

* * * * *